(12) United States Patent
Kanegae et al.

(10) Patent No.: US 9,035,385 B2
(45) Date of Patent: May 19, 2015

(54) METHOD FOR FABRICATING THIN-FILM SEMICONDUCTOR DEVICE AND THIN-FILM SEMICONDUCTOR DEVICE

(71) Applicant: Panasonic Corporation, Osaka (JP)

(72) Inventors: Arinobu Kanegae, Osaka (JP); Kenichirou Nishida, Hyogo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/009,233

(22) PCT Filed: Dec. 28, 2012

(86) PCT No.: PCT/JP2012/008461
§ 371 (c)(1),
(2) Date: Oct. 1, 2013

(87) PCT Pub. No.: WO2013/118233
PCT Pub. Date: Aug. 15, 2013

(65) Prior Publication Data
US 2014/0048807 A1 Feb. 20, 2014

(30) Foreign Application Priority Data
Feb. 6, 2012 (JP) ................. 2012-023450

(51) Int. Cl.
*H01L 23/62* (2006.01)
*H01L 27/12* (2006.01)
(Continued)

(52) U.S. Cl.
CPC ........... *H01L 27/088* (2013.01); *H01L 27/3262* (2013.01); *H01L 29/78618* (2013.01); *H01L 29/78696* (2013.01); *H01L 29/6675* (2013.01); *H01L 27/127* (2013.01)

(58) Field of Classification Search
USPC ................ 257/57, 59, 72, 350, 359, E31.041, 257/E27.1, E27.116, E27.117, E29.117, 257/E29.137, E29.1, 82, E29.202, E29.273, 257/E29.314, E29.32, E51.005, E29.151, 257/E29.294, E27.414, E27.121, E33.053, 257/E21.412, E33.062, E21.414, E29.003; 438/149, 158
See application file for complete search history.

(56) References Cited

U.S. PATENT DOCUMENTS 5,053,347 A * 10/1991 Wu ............................... 438/157
6,285,041 B1 * 9/2001 Noguchi ........................ 257/61
(Continued)

FOREIGN PATENT DOCUMENTS

JP 2005-108931 4/2005
JP 2009-076894 4/2009
(Continued)

OTHER PUBLICATIONS

International Search Report, mailed Apr. 16, 2013, in corresponding International Application No. PCT/JP2012/008461.

*Primary Examiner* — Evan Pert
*Assistant Examiner* — Gustavo Ramallo
(74) *Attorney, Agent, or Firm* — Greenblum & Bernstein, P.L.C.

(57) ABSTRACT

A thin-film semiconductor device having two thin-film transistors, wherein each of the two thin-film transistors includes: a gate electrode; a gate insulating film; a semiconductor layer; a channel protection layer; an intrinsic semiconductor layer; a contact layer in contact with a portion of sides of the channel region; a source electrode on the contact layer; and a drain electrode opposite to the source electrode on the contact layer, wherein the contact layer of one of the two thin-film transistors has a conductivity type different from a conductivity type of the contact layer of the other of the two thin-film transistors.

17 Claims, 16 Drawing Sheets

(51) Int. Cl.
   *H01L 21/00* (2006.01)
   *H01L 21/84* (2006.01)
   *H01L 27/088* (2006.01)
   *H01L 29/786* (2006.01)
   *H01L 29/66* (2006.01)
   *H01L 27/32* (2006.01)

(56) References Cited

U.S. PATENT DOCUMENTS

| | | | | |
|---|---|---|---|---|
| 6,583,576 | B2 * | 6/2003 | Koyama | 315/169.2 |
| 6,624,473 | B1 * | 9/2003 | Takehashi et al. | 257/344 |
| 7,378,124 | B2 * | 5/2008 | Daniels | 427/66 |
| 7,768,009 | B2 * | 8/2010 | Kobayashi et al. | 257/59 |
| 8,133,771 | B2 * | 3/2012 | Kobayashi et al. | 438/152 |
| 8,389,993 | B2 * | 3/2013 | Kobayashi et al. | 257/59 |
| 8,575,611 | B2 * | 11/2013 | Segawa | 257/59 |
| 8,587,501 | B2 * | 11/2013 | White et al. | 345/81 |
| 8,796,692 | B2 * | 8/2014 | Kanegae et al. | 257/72 |
| 8,823,002 | B2 * | 9/2014 | Takei et al. | 257/59 |
| 2002/0043660 | A1 * | 4/2002 | Yamazaki et al. | 257/59 |
| 2009/0057672 | A1 * | 3/2009 | Kobayashi et al. | 257/59 |
| 2010/0237355 | A1 * | 9/2010 | Moriguchi et al. | 257/72 |
| 2010/0285624 | A1 * | 11/2010 | Kobayashi et al. | 438/34 |
| 2012/0001190 | A1 * | 1/2012 | Okabe et al. | 257/66 |
| 2012/0129288 | A1 * | 5/2012 | Kobayashi et al. | 438/34 |
| 2013/0105798 | A1 * | 5/2013 | Kanegae et al. | 257/57 |

FOREIGN PATENT DOCUMENTS

| | | |
|---|---|---|
| JP | 2010-287634 | 12/2010 |
| WO | 2009/063606 | 5/2009 |

* cited by examiner

METHOD FOR FABRICATING THIN-FILM SEMICONDUCTOR DEVICE AND THIN-FILM SEMICONDUCTOR DEVICE

TECHNICAL FIELD

The present invention relates to a method for fabricating a thin-film semiconductor device and a thin-film semiconductor device.

BACKGROUND ART

Conventionally, thin-film semiconductor devices referred to as thin-film transistors (TFTs) have been used for active matrix display devices such as liquid crystal display devices and solid-state imaging devices such as digital cameras. In display devices, the TFTs are used as switching elements which select pixels, driving transistors which drive pixels, drivers outside of panels, or the like.

For instance, unlike a voltage-driven liquid crystal display, an organic EL display including organic electroluminescence (EL) elements using EL of an organic material is a current-driven display device. Thus, there is an urgent need for development of a high-performance thin-film transistor. A thin-film transistor includes, above a substrate, a gate electrode, a semiconductor layer (a channel layer), a source electrode, and a drain electrode. The channel layer generally includes a silicon thin film.

Moreover, it has been demanded that a screen size of a display device be increased and costs of the display device be reduced. In general, a bottom-gate thin-film transistor whose gate electrode is formed closer to a substrate than to a channel layer is used as a thin-film transistor which easily allows cost reduction.

Bottom-gate thin-film transistors are broadly categorized into two types, that is, a channel etching thin-film transistor whose channel layer is etched, and a channel protecting (etching stopper) thin-film transistor whose channel layer is protected from etching. Of these, the channel protecting thin-film transistor is capable of preventing damage to the channel layer by the etching, and of reducing an increase in characteristic variation in the surface of the substrate. In addition, the channel protecting thin-film transistor is capable of reducing the thickness of the channel layer and increasing ON characteristics by reducing parasitic resistance component, which is advantageous for high definition.

For this reason, the channel protecting thin-film transistor is suitable for a driving transistor in a current-driven organic EL display device using organic EL elements, for example.

Moreover, as stated above, because the organic EL element is the current-driven element, a thin-film transistor driving the organic EL element is preferably a polycrystalline silicon TFT including polycrystalline silicon excelling in a current drive capability. Consequently, it is possible to obtain a high current drive capability in a stacked TFT by forming a semiconductor layer, a source, and a drain with polycrystalline silicon. Moreover, especially in a p-type TFT, when a non-crystalline silicon film is used for a source and a drain, a resistance value becomes high significantly. For this reason, when the p-type TFT and a CMOS-type TFT using the p-type TFT are formed, the p-type TFT is preferably the polycrystalline silicon TFT.

As such a technique, a display device has been developed in which CMOS-type driving circuits advantageous for low power consumption are evenly formed in a plane using stacked TFTs including polycrystalline semiconductors (e.g., see Patent Literature (PTL) 1).

CITATION LIST

Patent Literature

[PTL 1] Japanese Unexamined Patent Application Publication No. 2005-108931

SUMMARY OF INVENTION

Technical Problem

In the conventional channel protecting thin-film semiconductor device, the positive fixed electric charge is present in the channel protection layer. For this reason, a back channel is formed in a channel layer (crystalline silicon thin film) due to the fixed electric charge.

This causes a leak current in the thin-film semiconductor device and deteriorates OFF characteristics of the thin-film semiconductor device, and thus the structure of the channel protecting thin-film transistor degrades the TFT performance.

Moreover, because a contact of a source and a drain is formed by stacking a $p^+$-type layer and an $n^+$-type layer in a p-type TFT in a conventional display device, each of the source and the drain is a diode. Thus, when a voltage is applied to a gate electrode, an opposite voltage is always applied to one of the source and the drain. As a result, a desired current does not flow between the source and the drain of the p-type TFT due to current characteristics of the diode, which degrades the TFT performance.

In view of the above problem, an object of the present invention is to provide a method for fabricating a thin-film semiconductor device whose TFT performance is increased, and a thin-film semiconductor device.

Solution to Problem

In order to achieve the object, a method for fabricating a thin-film semiconductor device according to an aspect of the present invention is a method for fabricating a thin-film semiconductor device having two thin-film transistors, the method comprising: preparing a substrate; forming two gate electrodes on the substrate; forming a gate insulating film on the substrate and the two gate electrodes; forming, on the gate insulating film, semiconductor layers each having, as a channel region, a region that is opposite to a corresponding one of the two gate electrodes with the gate insulating film therebetween; forming, by application, channel protection layers above the respective channel regions, the channel protection layers being separated from each other; etching the semiconductor layers using the channel protection layers as masks; forming a first contact layer of a first conductivity type on a portion of one of the channel protection layers and on a portion of sides of one of the semiconductor layers that is below the one of the channel protection layers; forming a second contact layer of a second conductivity type on a portion of the other of the channel protection layers and on a portion of sides of the other of the semiconductor layers that is below the other of the channel protection layers, the second conductivity being different from the first conductivity type; and forming a source electrode on a portion of each of the first contact layer and the second contact layer, and forming a drain electrode on an other portion of each of the first contact layer and the second contact layer to be opposite to the source electrode.

Advantageous Effects of Invention

According to the present invention, it is possible to provide a method for fabricating a thin-film semiconductor device whose TFT performance is increased, and a thin-film semiconductor device.

DESCRIPTION OF EMBODIMENTS (Underlying Knowledge Forming Basis of the Present Invention)

In the conventional channel protecting thin-film semiconductor device, the positive fixed electric charge is present in the channel protection layer. In the channel protection layer formed by application, especially an amount of the positive fixed electric charge is larger than that of a channel protection layer formed by CVD. For this reason, a back channel is formed in a channel layer (crystalline silicon thin film) due to the fixed electric charge.

Here, the back channel refers to a pathway of parasitic current from a source electrode to a drain electrode via a neighborhood of an interface with the channel protection layer in a channel layer. The formation of the back channel causes a leak current in the thin-film semiconductor device. This deteriorates the OFF characteristics of the thin-film semiconductor device, and thus the structure of the channel protecting thin-film transistor degrades the TFT performance.

Figure 17:
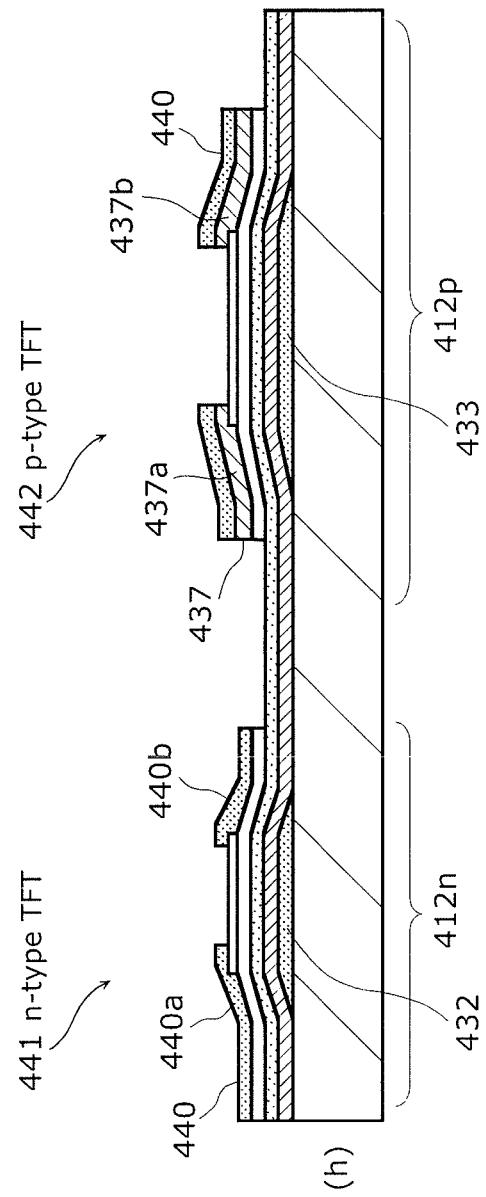
FIG. 17 is a schematic diagram showing an exemplary structure of a conventional thin-film semiconductor device.

FIG. 17 is a cross-sectional view showing a structure of a conventional display device. This display device includes an n-type TFT and a p-type TFT.

An n-type TFT 441 in FIG. 17 includes, above a substrate 412, a gate electrode 432, a gate insulating film, an active layer, an n-type source 440a, and an n-type drain 440b. A p-type TFT 442 includes, above a substrate 412p, a gate electrode 433, a gate insulating film, an active layer, a p-type source 437a, and a p-type drain 437b. n+-type layers 440 deposited simultaneously when the n-type source 440a and the n-type drain 440b of the n-type TFT 441 are formed are respectively formed on p+-type layers 437 each included in a corresponding one of the p-type source 437a and the p-type drain 437b.

As shown in FIG. 17, in the p-type TFT 442, a contact of the p-type source 437a and the p-type drain 437b includes the $p^+$-type layers 437 and the $n^+$-type layers 440 that are stacked. In other words, each of the p-type source 437a and the p-type drain 437b is a diode. Consequently, when a voltage is applied to the gate electrode 433, an opposite voltage is always applied to one of the p-type source 437a and the p-type drain 437b. Thus, a desired current does not flow between the source and drain of the p-type TFT 442 due to current characteristics of the diode, which degrades the TFT performance.

In view of this, as described below, the present invention achieves a method for fabricating a thin-film semiconductor device whose TFT performance is increased, and a thin-film semiconductor device.

A method for fabricating a thin-film semiconductor device according to an aspect of the present invention is a method for fabricating a thin-film semiconductor device having two thin-film transistors, the method comprising: preparing a substrate; forming two gate electrodes on the substrate; forming a gate insulating film on the substrate and the two gate electrodes; forming, on the gate insulating film, semiconductor layers each having, as a channel region, a region that is opposite to a corresponding one of the two gate electrodes with the gate insulating film therebetween; forming, by application, channel protection layers above the respective channel regions, the channel protection layers being separated from each other; etching the semiconductor layers using the channel protection layers as masks; forming a first contact layer of a first conductivity type on a portion of one of the channel protection layers and on a portion of sides of one of the semiconductor layers that is below the one of the channel protection layers; forming a second contact layer of a second conductivity type on a portion of the other of the channel protection layers and on a portion of sides of the other of the semiconductor layers that is below the other of the channel protection layers, the second conductivity being different from the first conductivity type; and forming a source electrode on a portion of each of the first contact layer and the second contact layer, and forming a drain electrode on an other portion of each of the first contact layer and the second contact layer to be opposite to the source electrode.

With this configuration, the p-type contact layer and the n-type contact layer are not stacked in the p-type TFT, and thus it is possible to increase source-drain current characteristics. Moreover, in the two thin-film transistors, because the contact layer is formed on the portion of the top and sides of the channel protection layer and on the portion of the sides of the semiconductor layer, and functions as an electric field when a drain current is high, it is possible to increase reliability of the thin-film semiconductor device by decreasing a source-drain OFF-state current. Furthermore, because the semiconductor layer and the contact layer can be made directly in contact with each other, a contact portion where the semiconductor layer and the contact layer are directly in contact with each other is effective mainly as a current inlet. Consequently, it is possible to provide a thin-film semiconductor device whose TFT performance is increased.

Moreover, the n-type TFT and the p-type TFT have the same structure except that the conductivity types of the contact layers are opposite, and thus it is possible to form the channel protection layers in the same shape by performing back exposure under the same condition using the gate electrodes as masks. Consequently, it is possible to easily form a thin-film semiconductor device having a CMOS structure.

Furthermore, in comparison to a method for fabricating a CMOS structure using low-temperature polysilicon (LTPS), the p-type TFT and the n-type TFT can be formed differently without a step of impurity implantation, and thus it is possible to deal with increasing the CMOS structure in size, which has been conventionally difficult using the LTPS. Moreover, it is possible to reduce the number of masks for impurity implantation. Thus, it is possible to reduce the cost of fabricating the CMOS structure.

Moreover, the first contact layer and the second contact layer may have an average grain size smaller than an average grain size of the channel region.

With this configuration, the thin-film semiconductor device makes it possible to decrease an OFF-state current.

Moreover, each of the semiconductor layers may include a semiconductor film and an intrinsic semiconductor layer that is non-crystalline, the forming of semiconductor layers may include forming the intrinsic semiconductor layer at least on the channel region, and in the forming of the intrinsic semiconductor layer, the intrinsic semiconductor layer may be formed to satisfy $E_{cp} < E_{c1}$, where energy levels at lower edges of conduction bands of the semiconductor film and the intrinsic semiconductor layer are $E_{cp}$ and $E_{c1}$, respectively.

With this configuration, the amorphous silicon film is provided as a back channel layer, and thus it is possible to perform a field shield by offsetting positive fixed electric charge of the channel protection layer by a charge density of negative carrier in a localized level density (trap density) of the intrinsic semiconductor layer. With this, it is possible to reduce the formation of the back channel, and inhibit a leak current at an off time, thereby increasing the OFF characteristics. In addition, it is possible to reduce an occurrence of a kink phenomenon that is a phenomenon in which the drain current increases rapidly.

Moreover, in the forming of the intrinsic semiconductor layer, a first intrinsic semiconductor film may be formed as the intrinsic semiconductor layer on the semiconductor film, and a second intrinsic semiconductor film may be formed as the intrinsic semiconductor layer on the first intrinsic semiconductor film, and the first intrinsic semiconductor film and the second intrinsic semiconductor film may be formed of an amorphous silicon film.

With this configuration, it is easy to form the intrinsic semiconductor layer having a crystallization rate that varies as its deposition progresses from near the surface of the semiconductor film. In addition, the first intrinsic semiconductor film and the second intrinsic semiconductor film are each formed of the amorphous silicon film, and thus it is possible to increase the OFF characteristics by reducing the formation of the back channel due to the positive fixed electric charge contained in the channel protection layer.

Moreover, wherein in the forming of the intrinsic semiconductor layer, the first intrinsic semiconductor film and the second intrinsic semiconductor film may be continuously formed in a same vacuum apparatus, and the first intrinsic semiconductor film and the second intrinsic semiconductor film may be formed to achieve a crystallization rate of the first intrinsic semiconductor film higher than a crystallization rate of the second intrinsic semiconductor film.

With this configuration, in a fabricating step, an opposite polarity film is never exposed to a contact portion because the first intrinsic semiconductor film and the second intrinsic semiconductor film are continuously formed in the same vacuum apparatus, and thus dopants included in the n-type semiconductor and the p-type semiconductor do not move to and from the opposite polarity film. As a result, it is possible to form a high-performance TFT. In addition, because the first intrinsic semiconductor film and the second intrinsic semiconductor film are formed to achieve the crystallization rate of the first intrinsic semiconductor film higher than the crystallization rate of the second intrinsic semiconductor film, it is possible to easily satisfy $E_{cp} < E_{c1}$.

Moreover, the forming of a second contact layer may include: forming the second contact layer on a portion of the other of the channel protection layers, on a portion of the sides of the other of the semiconductor layers that is below the other of the channel protection layers, and above the first contact layer; and removing the second contact layer formed above the first contact layer.

With this configuration, it is possible to form the first contact layer on the portion of the one channel protection layer and on the portion of the sides of the one semiconductor layer below the one channel protection layer, and form the second contact layer on the portion of the other channel protection layer and the portion of the sides of the other semiconductor layer below the other channel protection layer.

Moreover, in the forming of a first contact layer, the first contact layer may be formed to have a film thickness greater than a film thickness of the second contact layer.

With this configuration, it is possible to prevent the film thickness of the first contact layer from being reduced, in the removing of the second contact layer formed above the first contact layer.

Moreover, each of the semiconductor layers may have a channel direction length equal to a channel direction length of each of the channel protection layers.

With this configuration, it is possible to form a CMOS transistor having a suitable structure.

A thin-film semiconductor device according to another aspect of the present invention is a thin-film semiconductor device having two thin-film transistors, wherein each of the two thin-film transistors includes: a gate electrode; a gate insulating film on the gate electrode; a semiconductor layer which is on the gate insulating film and has, as a channel region, a region that is opposite to the gate electrode with the gate insulating film therebetween; a channel protection layer on the channel region; a contact layer in contact with a portion of sides of the channel region; a source electrode on the contact layer; and a drain electrode opposite to the source electrode on the contact layer, wherein the contact layer of one of the two thin-film transistors has a conductivity type different from a conductivity type of the contact layer of the other of the two thin-film transistors.

With this structure, the p-type contact layer and the n-type contact layer are not stacked in the p-type TFT, and thus it is possible to increase source-drain current characteristics. Moreover, in the two thin-film transistors, because the contact layer is formed on the portion of the top and sides of the channel protection layer and on the portion of the sides of the semiconductor layer, and functions as an electric field when a drain current is high, it is possible to increase reliability of the thin-film semiconductor device by decreasing a source-drain OFF-state current. Furthermore, because the semiconductor layer and the contact layer can be made directly in contact with each other, a contact portion where the semiconductor layer and the contact layer are directly in contact with each other is effective mainly as a current inlet. Consequently, it is possible to provide a thin-film semiconductor device whose TFT performance is increased.

Moreover, the n-type TFT and the p-type TFT have the same structure except that the conductivity types of the contact layers are opposite, and thus it is possible to form the channel protection layers in the same shape by performing back exposure under the same condition using the gate electrodes as masks. Consequently, it is possible to easily form a thin-film semiconductor device having a CMOS structure.

Furthermore, in comparison to a method for fabricating a CMOS structure using low-temperature polysilicon (LTPS), the p-type TFT and the n-type TFT can be formed differently without a step of impurity implantation, and thus it is possible to deal with increasing the CMOS structure in size, which has been conventionally difficult using the LTPS. Moreover, it is possible to reduce the number of masks for impurity implantation. Thus, it is possible to reduce the cost of fabricating the CMOS structure.

Moreover, the first contact layer and the second contact layer may have an average grain size smaller than an average grain size of the channel region.

With this structure, the thin-film semiconductor device makes it possible to decrease an OFF-state current.

Moreover, each of the two thin-film transistors may include a channel protection layer above the semiconductor layer, and the channel protection layer may have a channel direction length equal to a channel direction length of the semiconductor layer.

With this structure, the n-type TFT and the p-type TFT have the same structure except that the conductivity types of the contact layers are opposite, and thus it is possible to form the channel protection layers in the same shape by performing back exposure under the same condition using the gate electrodes as masks. Consequently, it is possible to easily form a thin-film semiconductor device having a CMOS structure.

Moreover, the channel protection layer may be made of an organic material.

Moreover, the thin-film semiconductor device may be a complementary metal-oxide-semiconductor device.

Moreover, the semiconductor layer may include: a semiconductor film; and an intrinsic semiconductor layer that is non-crystalline and between the semiconductor film and the channel protection layer.

With this structure, the amorphous silicon film is provided as a back channel layer, and thus it is possible to perform a field shield by offsetting positive fixed electric charge of the channel protection layer by a charge density of negative carrier in a localized level density (trap density) of the intrinsic semiconductor layer. With this, it is possible to reduce the formation of the back channel, and inhibit a leak current at a off time, thereby increasing the OFF characteristics.

Moreover, the semiconductor film may be formed of crystalline silicon, and the intrinsic semiconductor layer may be formed of amorphous silicon.

With this structure, it is easy to form the intrinsic semiconductor layer having a crystallization rate that varies as its deposition progresses from near the surface of the semiconductor film. In addition, the first intrinsic semiconductor film and the second intrinsic semiconductor film are each formed of the amorphous silicon film, and thus it is possible to increase the OFF characteristics by reducing the formation of the back channel.

Moreover, $E_{cp} < E_{c1}$ may be satisfied, where energy levels at lower edges of conduction bands of the semiconductor film and the intrinsic semiconductor layer are $E_{cp}$ and $E_{c1}$, respectively.

With this structure, it is possible to reduce the occurrence of the kink phenomenon which is the phenomenon in which the drain current increases rapidly, and thus it is possible to achieve the thin-film semiconductor device whose TFT performance is increased.

Moreover, the intrinsic semiconductor layer may include a first intrinsic semiconductor film formed on the semiconductor film, and a second intrinsic semiconductor film formed on the first intrinsic semiconductor film, and the first intrinsic semiconductor film and the second intrinsic semiconductor film may have different electron affinities.

With this structure, it is possible to adjust the energy level $E_{c1}$ at the lower edge of the conduction band.

Moreover, each of the first intrinsic semiconductor film and the second intrinsic semiconductor film may include silicon as a main component, and have a different band gap.

With this structure, it is possible to adjust the energy level $E_{C1}$ at the lower edge of the conduction band.

Moreover, each of the first intrinsic semiconductor film and the second intrinsic semiconductor film may be an amorphous silicon film.

With this structure, it is possible to increase the OFF characteristics by reducing the formation of the back channel due to fixed electric charge contained in the insulating film formed by application.

Moreover, the first intrinsic semiconductor film may have a crystallization rate higher than a crystallization rate of the second intrinsic semiconductor film.

With this structure, it is possible to easily satisfy $E_{cp} < E_{c1}$.

Moreover, an energy level $E_{CP}$ at a lower edge of a conduction band of the semiconductor film and an energy level $E_{C1}$ at a lower edge of conduction band of the first intrinsic semiconductor film may be adjusted to prevent a spike from occurring in a part where the semiconductor film and the first intrinsic semiconductor film are connected.

With this structure, it is possible to reduce the occurrence of the kink phenomenon which is the phenomenon in which the drain current increases rapidly, and thus it is possible to achieve the thin-film semiconductor device whose TFT performance is increased.

Although a method for fabricating a thin-film semiconductor device according to the present invention is described below based on embodiments, the present invention is defined based on the scope of the claims. Thus, among the structural elements in the following embodiments, structural elements not recited in any of the claims are not always necessary for solving the problem of the present invention, but are described as making up more suitable embodiments. It is to be noted that each figure is a schematic diagram, and does not necessarily illustrate exactly.

Embodiment 1

Structure of Thin-Film Semiconductor Device

Figure 1:
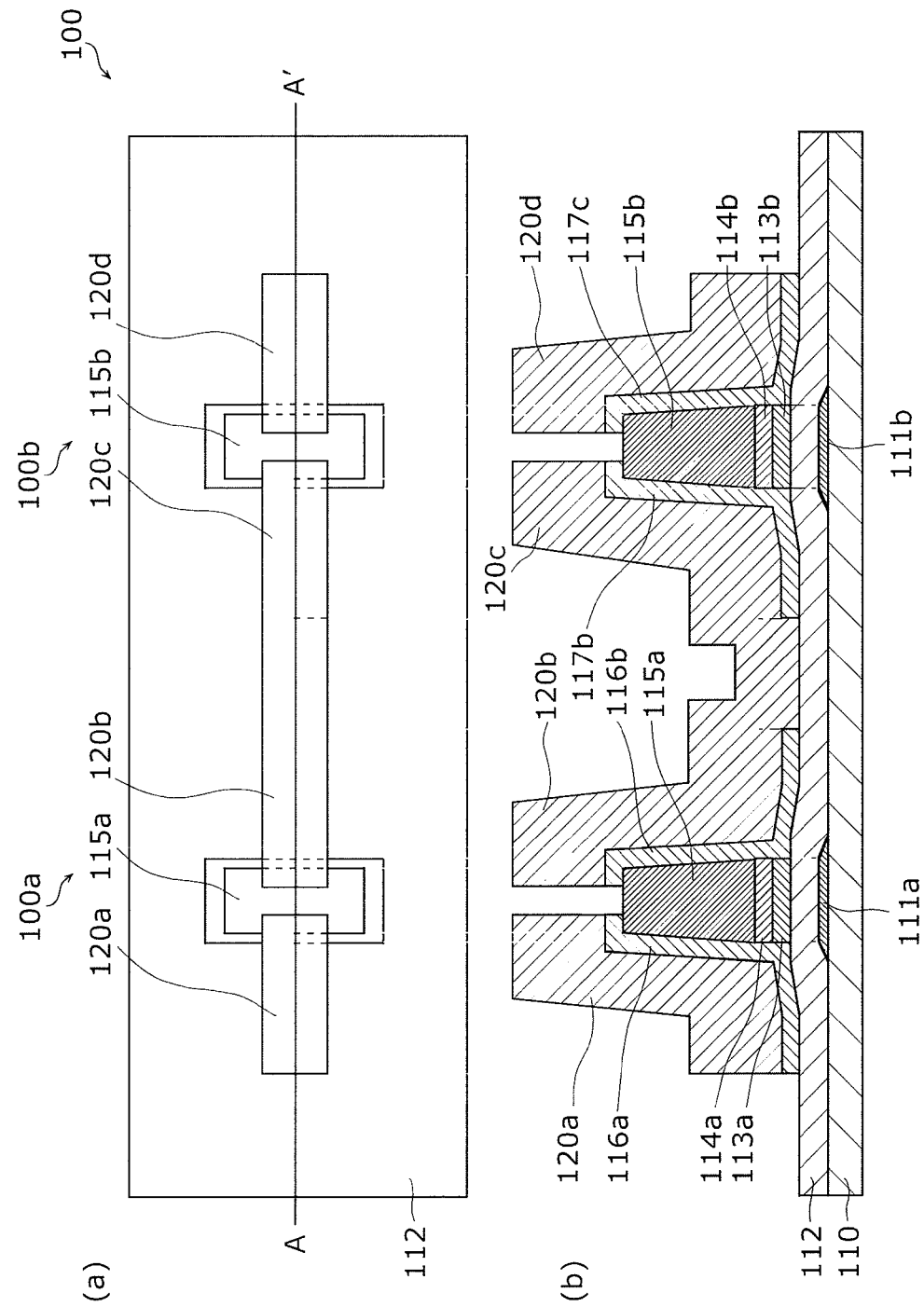
FIGS. 1(a) and (b) are schematic diagrams showing a structure of a thin-film semiconductor device according to Embodiment 1.

First, the following describes a structure of a thin-film semiconductor device 100 according to Embodiment 1 of the present invention, with reference to FIG. 1. FIG. 1 is a schematic diagram showing the structure of the thin-film semiconductor device 100 according to this embodiment of the present invention. (a) in the figure is a top view, and (b) in the figure is a cross-sectional view along A-A' line.

As shown in FIG. 1, the thin-film semiconductor device 100 according to this embodiment of the present invention is a thin-film semiconductor device including thin-film transistors 100a and 100b having opposite polarities. The thin-film transistors 100a and 100b are formed on a substrate 110, a gate electrode 111a and a gate electrode 111b formed on the substrate 110, and a gate insulating film 112 formed on the substrate 110 and the gate electrodes 111a and 111b, and constitute a complementary metal-oxide-semiconductor (CMOS) device.

The thin-film transistor 100a, one of the two thin-film transistors, is a transistor of n-type conductivity type, a first conductivity type, and includes: a semiconductor layer formed above the gate electrode 111a and having a channel region; contact layers 116a and 116b of n-type conductivity type formed in contact with portions of sides of the semiconductor layer; a source electrode 120a formed on the contact layer 116a; and a drain electrode 120b formed opposite to the source electrode 120a on the contact layer 116b. Moreover, a channel protection layer 115a is formed above the semiconductor layer. Furthermore, the semiconductor layer includes a semiconductor film 113a, and an intrinsic semiconductor layer 114a formed between the semiconductor film 113a and the channel protection layer 115a. Here, the contact layers 116a and 116b correspond to a first contact layer in the present invention.

The thin-film transistor 100b, the other of the two thin-film transistors, is a transistor of p-type conductivity type, a second conductivity type opposite to the first conductivity type, and includes: a semiconductor layer formed above the gate electrode 111b and having a channel region; contact layers 117b and 117c of p-type conductivity type formed in contact with portions of sides of the semiconductor layer; a source electrode 120c formed on the contact layer 117b; and a drain electrode 120d formed opposite to the source electrode 120c on the contact layer 117c. Moreover, a channel protection layer 115b is formed above the semiconductor layer. Furthermore, the semiconductor layer includes a semiconductor film 113b and an intrinsic semiconductor layer 114b that is formed between the semiconductor film 113b and the channel protection layer 115b. Here, the contact layers 117b and 117c correspond to a second contact layer in the present invention.

The following describes in detail each structural element of the thin-film semiconductor device 100 according to this embodiment.

The substrate 110 is, for instance, a glass substrate made of a glass material such as silica glass, alkali-free glass, and highly heat-resistant glass. It is to be noted that an undercoat layer made of a silicon nitride (SiNx) film, a silicon oxide ($SiO_y$), silicon oxynitride ($SiO_yNx$) film, or the like may be formed on the substrate 110, to prevent impurity such as sodium and phosphorus in the glass substrate from entering the semiconductor films 113a and 113b. In addition, the undercoat layer sometimes functions to buffer heat on the substrate 110 in a high-temperature thermal treatment process such as laser annealing. The film thickness of the undercoat layer can be approximately from 100 to 2000 nm, for example.

The gate electrodes 111a and 111b are patterned in a predetermined shape on the substrate 110. The gate electrodes 111a and 111b can be made of a single-layer structure or multilayer structure of a conductive material, an alloy of conductive materials, or the like, and be formed of molybdenum (Mo), aluminum (Al), copper (Cu), tungsten (W), titanium (Ti), chrome (Cr), molybdenum tungsten (MoW), or the like. The film thickness of each of the gate electrodes 111a and 111b can be approximately from 20 to 500 nm, for instance.

The gate insulating film 112 is formed on the gate electrodes 111a and 111b, and formed on the whole surface of the substrate 110 to cover the gate electrodes 111a and 111b in this embodiment. The gate insulating film 112 can be formed of, for example, a single-layer film of silicon oxide ($SiO_y$), silicon nitride ($SiN_x$), silicon oxynitride ($SiO_yN_x$), aluminum oxide ($AlO_z$), or tantalum oxide ($TaO_w$), or a stacked-layer film of these materials. The film thickness of the gate insulating film 112 can be from 50 to 300 nm, for instance.

It is to be noted that because the semiconductor films 113a and 113b are each included as a semiconductor layer to be a channel region of a corresponding one of TFTs in this embodiment, silicon oxide is preferably used as the gate insulating film 112. This is because a state of the interface between the semiconductor films 113a and 113b and the gate insulating film 112 is preferably made satisfactory to maintain favorable threshold voltage characteristics in the TFT, and silicon oxide is suitable for this purpose.

The semiconductor films 113a and 113b each are a semiconductor layer which is on the gate insulating film 112 and in which a region that is opposite to the gate electrodes 111a and 111b with the gate insulating film 112 therebetween is a channel region. Specifically, the semiconductor films 113a and 113b each are a semiconductor film including a crystalline silicon thin film 113 formed on the gate insulating film 112, and have a predetermined channel region that is a region in which the movement of carriers is controlled with the voltage of the gate electrodes 111a and 111b. The channel length of the TFT is defined as a width of the channel protection layers 115a and 115b.

The semiconductor films 113a and 113b each are, for instance, a crystalline silicon thin film having a crystalline organizational structure, and include a microcrystalline silicon thin film or a polysilicon thin film. In this case, the semiconductor films 113a and 113b can be formed by crystallizing non-crystalline silicon (amorphous silicon). Moreover, the semiconductor films 113a and 113b may each be an amorphous silicon film or a film including amorphous silicon. For example, the semiconductor films 113a and 113b may each be a silicon thin film having a mixed crystal structure of amorphous silicon (non-crystalline silicon) and crystalline silicon. In this case, to obtain superior ON characteristics, at least the predetermined channel region of each of the semiconductor films 113a and 113b is preferably formed of a film having a high ratio of crystalline silicon. The film thickness of each of the semiconductor films 113a and 113b can be approximately from 20 to 100 nm, for instance. It is to be noted that the principal plane direction of the silicon crystal included in the semiconductor films 113a and 113b is preferably [100]. With this, it is possible to form the semiconductor films 113a and 113b having superior crystallinity.

It is to be noted that the average grain size of the crystal silicon in the semiconductor films 113a and 113b is from approximately 5 to 1000 nm, and the semiconductor films 113a and 113b include polycrystal having an average grain size of 100 nm or more, or fine crystal referred to as microcrystal (μc) having an average grain size of 10 to 100 nm.

The intrinsic semiconductor layers 114a and 114b are intrinsic semiconductor layers formed on the semiconductor films 113a and 113b, and specifically each are an amorphous silicon film not intentionally doped with an impurity.

The intrinsic semiconductor layers 114a and 114b are formed on the respective surfaces of the semiconductor films 113a and 113b. The film thickness of each of the intrinsic semiconductor layers 114a and 114b can be approximately 20 nm. It is to be noted that a suitable range of the film thickness of each of the intrinsic semiconductor layers 114a and 114b is from 20 to 140 nm.

Where energy levels at the lower edges of conduction bands (CBs) of the semiconductor films 113a and 113b and the intrinsic semiconductor layers 114a and 114b are $E_{cp}$ and $E_{c1}$, respectively, the semiconductor films 113a and 113b and the intrinsic semiconductor layers 114a and 114b are configured to satisfy $E_{cp}<E_{c1}$.

Moreover, in this embodiment, the intrinsic semiconductor layers 114a and 114b are each configured to have a crystallization rate that varies as its deposition progresses from near the surface of a corresponding one of the semiconductor films 113a and 113b. In this case, the intrinsic semiconductor layers 114a and 114b near the surfaces of the semiconductor films 113a and 113b are each preferably configured to have a crystallization rate higher than that of parts of the intrinsic semiconductor layers 114a and 114b which are away from near the surfaces of the semiconductor films 113a and 113b. Setting the crystallization rates in this manner easily allows $E_{CP}<E_{C1}$.

The intrinsic semiconductor layers 114a and 114b in this embodiment include crystal silicon grains having a grain size of at least 5 nm and at most 100 nm. Moreover, the intrinsic semiconductor layers 114a and 114b each have a crystallization rate in a thickness direction that gradually increases toward the semiconductor films 113a and 113b, and the intrinsic semiconductor layers 114a and 114b include the crystal silicon grains whose grain size gradually increases toward the semiconductor films 113a and 113b in this embodiment. In contrast, the parts of the intrinsic semiconductor layers 114a and 114b away from near the surfaces of the semiconductor films 113a and 113b are not crystallized, and thus each have a crystallization rate of zero.

It is to be noted that a crystallization rate means, when a semiconductor film includes, for instance, silicon as a main component, a degree of crystallization of a composition of the silicon semiconductor film. The crystallization rate can be expressed in, for example, the size of the crystal grain as above, a density of the same crystal grains, and so on. In addition, the crystallization rate can be expressed as a crystallization rate only by crystalline component or as a crystallization rate by crystalline component and non-crystalline component (amorphous component).

In this embodiment, the intrinsic semiconductor layers 114a and 114b are each formed of intrinsic amorphous silicon not intentionally doped with an impurity. It is to be noted that although generally a composition of an amorphous silicon film includes only amorphous component, a composition of an amorphous silicon film in this embodiment additionally includes microcrystalline component.

The channel protection layers 115a and 115b each are a channel protection layer that protects a semiconductor layer including a channel region (semiconductor films 113a and 113b and intrinsic semiconductor layers 114a and 114b). To put it another way, the channel protection layers 115a and 115b each function as a channel etching stopper (CES) layer, and have a function of preventing the semiconductor films 113a and 113b and the intrinsic semiconductor layers 114a and 114b in the channel regions from being etched in an etching process when the contact layers 116a and 116b in a pair and the contact layers 117b and 117c in a pair are formed.

The channel protection layers 115a and 115b are formed above the channel regions and on the semiconductor layers. In this embodiment, the channel protection layers 115a and 115b are formed in regions that are right on the intrinsic semiconductor layers 114a and 114b and correspond to the channel regions.

Specifically, in the thin-film transistor 100a, a channel direction length of the channel protection layer 115a is made equal to that of the semiconductor layer. Moreover, in the thin-film transistor 100b, a channel direction length of the channel protection layer 115b is made equal to that of the semiconductor layer.

Here, the expression "a channel direction length of the channel protection layer" refers to a channel direction length of each of the channel protection layers 115a and 115b on a corresponding one of the intrinsic semiconductor layers 114a and 114b. Moreover, the expression "a channel direction length of the channel protection layer is made equal to that of the semiconductor layer" includes a case where the lengths are substantially equal in consideration of a variation caused by etching of the channel protection layers 115a and 115b.

Moreover, the channel protection layers 115a and 115b each mainly include a material containing oxygen and carbon, and are formed by a method of application. In this embodiment, the channel protection layers 115a and 115b are each formed by patterning or solidifying a photosensitive application-type organic material. Examples of the organic material included in the channel protection layers 115a and 115b include an organic resin material, a surfactant, a solvent, and a photosensitizer. Moreover, the channel protection layers may each include an inorganic material as a main component. For instance, a spin on glass (SOG) material represented by boron phosphorus silicon glass (BPSG) which is a $SiO_2$ film including boron and phosphorus or the like may be used for the channel protection layers.

A photosensitive or non-photosensitive organic resin material containing one or more of polyimide, acryl, polyamide, polyimideamide, resist, benzocyclobutene, and so on can be used as an organic resin material that is a main component of each of the channel protection layers 115a and 115b. A surfactant including a silicon compound such as siloxane can be used as the surfactant. An organic solvent such as propylene glycol monomethyl ether acetate and 1,4-dioxane can be used as the solvent. Moreover, a positive photosensitizer such as naphthoquinone diazide can be used as the photosensitizer. It is to be noted that the photosensitizer includes not only carbon but also sulfur.

When the channel protection layers 115a and 115b are formed, the above organic material is used in the method of application such as spin coating. It is to be noted that not only the method of application but also other methods such as droplet discharging can be used for forming the channel protection layers 115a and 115b. For instance, it is also possible to selectively form an organic material in a predetermined shape, by using a method of printing which allows a predetermined pattern to be formed such as screen printing and offset printing.

The film thickness of each of the channel protection layers 115a and 115b is from 300 to 1000 nm, for example. The lower limit of the film thickness of each of the channel protection layers 115a and 115b is determined by considering a margin by etching and reduction of influence of fixed electric charge in a corresponding one of the channel protection layers 115a and 115b. Moreover, the upper limit of the film thickness of each of the channel protection layers 115a and 115b is determined by considering reduction of a decrease in process reliability associated with an increase in step between the contact layers 116a and 116b in the pair and the contact layers 117b and 117c in the pair, and the source electrodes 120a and 120c and the drain electrodes 120b and 120d.

In the thin-film transistor 100a, each of the contact layers 116a and 116b in the pair includes a non-crystalline semiconductor film containing highly concentrated impurities, and is formed on the channel protection layer 115a. Stated differently, the contact layers 116a and 116b in the pair are formed above the channel region of the semiconductor film 113a with the channel protection layer 115a therebetween. In addition, the contact layers 116a and 116b are placed opposite to each other with a predetermined distance therebetween. It is to be noted that the expression "on the channel protection layer" which the contact layers are formed means at least a portion of the top or side of the channel protection layer.

In other words, in this embodiment, one of the contact layers 116a and 116b in the pair (e.g., contact layer 116a) is formed over one end of the channel protection layer 115a and the intrinsic semiconductor layer 114a, and is formed to cover a top and a side at the one end of the channel protection layer 115a, and sides of the intrinsic semiconductor layer 114a and the semiconductor film 113a in one of side regions of the channel protection layer 115a.

Moreover, the other of the contact layers 116a and 116b in the pair (e.g., contact layer 116b) is formed over the other end of the channel protection layer 115a, the intrinsic semiconductor layer 114a, and the semiconductor film 113a, and is formed to cover a top and a side at the other end of the channel protection layer 115a, and the other sides of the intrinsic semiconductor layer 114a and the semiconductor film 113a in the other of the side regions of the channel protection layer 115a.

In other words, the contact layers 116a and 116b in the pair are each formed to cover a corresponding one of the portions of the channel protection layer 115a and in contact with a corresponding one of the portions of the sides of the intrinsic semiconductor layer 114a included in the semiconductor layer 113a. Because this structure allows the contact layers 116a and 116b to function as electric field relaxation layers when a drain current is high, it is possible to increase the reliability of the thin-film semiconductor device by decreasing a source-drain OFF-state current. In particular, when the contact layers 116a and 116b are formed on the top of the channel protection layer 115a functioning as the CES, it is possible to produce this effect more easily. It is to be noted that a contact portion where the contact layers 116a and 116b are in contact with portions of the sides of the intrinsic semiconductor layer 114a and the semiconductor film 113a that are included in the semiconductor layer is effective mainly as a current inlet.

It is to be noted that although the effect can be achieved in any of the p-type semiconductor and the n-type semiconductor, the effect is effective especially in the n-type semiconductor.

Each of the contact layers 116a and 116b in the pair can be formed of, for instance, an n-type semiconductor film in which phosphorous (P) is doped as an impurity to amorphous silicon, and is an $n^+$ layer having a highly concentrated impurity of $1\times10^{19}$ [atm/cm$^3$] or more. Moreover, the film thickness of each of the contact layers 116a and 116b can be from 5 to 100 nm, for example.

It is to be noted that the contact layers 116a and 116b in the pair may each include two layers of a lower electric field relaxation layer ($n^-$ layer) having a low concentration and an upper contact layer ($n^+$ layer) having a high concentration. Phosphorous of approximately $1\times10^{17}$ [atm/cm$^3$] is doped in the electric field relaxation layer having the low concentration. The two layers can be continuously formed in the chemical vapor deposition (CVD) apparatus.

Moreover, in the thin-film transistor 100b, each of the contact layers 117b and 117c in the pair includes a non-crystalline semiconductor film having highly concentrated impurity, and is formed on the channel protection layer 115b. To put it another way, the contact layers 117b and 117c in the pair are formed above the channel region of the semiconductor film 113b with the channel protection layer 115b therebetween. In addition, the contact layers 117b and 117c in the pair are placed opposite to each other with a predetermined distance therebetween.

In this embodiment, one of the contact layers 117b and 117c in the pair (e.g., contact layer 117b) is formed over an one end of the channel protection layer 115b, the intrinsic semiconductor layer 114b, and the semiconductor film 113b, and is formed to cover a top and a side at the one end of the channel protection layer 115b, and sides of the intrinsic semiconductor layer and the semiconductor film 113b in one of side regions of the channel protection layer 115b.

Moreover, the other of the contact layers 117b and 117c in the pair (e.g., contact layer 117c) is formed over the other end of the channel protection layer 115a, the intrinsic semiconductor layer 114b, and the semiconductor film 113b, and is formed to cover a top and a side at the other end of the channel protection layer 115b, and the other sides of the intrinsic semiconductor layer 114b and the semiconductor film 113b in the other of the side regions of the channel protection layer 115b.

Stated differently, the contact layers 117b and 117c in the pair are each formed to cover a corresponding one of the portions of the channel protection layer 115b and in contact with a corresponding one of the portions of the sides of the intrinsic semiconductor layer 114b and the semiconductor film 113b that are included in the semiconductor layer. Because this structure allows the contact layers 117b and 117c to function as electric field relaxation layers when a drain current is high, it is possible to increase the reliability of the thin-film semiconductor device 100 by decreasing the source-drain OFF-state current. In particular, when the contact layers 117b and 117c are formed on the top of the channel protection layer 115a functioning as the CES, it is possible to produce this effect more easily. It is to be noted that a contact portion where the contact layers 117b and 117c are in contact with the portions of the sides of the intrinsic semiconductor layer 114b and the semiconductor film 113b that are included in the semiconductor layer is effective mainly as a current inlet.

It is to be noted that although the effect can be achieved in any of the p-type semiconductor and the n-type semiconductor, the effect is effective especially in the n-type semiconductor.

Each of the contact layers 117b and 117c in the pair can be formed of, for instance, a p-type semiconductor film in which boron (B) is doped as an impurity to amorphous silicon, and is a $p^+$ layer having a highly concentrated impurity of $1\times10^{19}$ [atm/cm$^3$] or more. Moreover, the film thickness of each of the contact layers 117b and 117c can be from 5 to 100 nm, for example.

It is to be noted that each of the contact layers 117b and 117c in the pair may include two layers of a lower electric field relaxation layer (p layer) having a low concentration and an upper contact layer (p+ layer) having a high concentration. Boron of approximately $1 \times 10^{17}$ [atm/cm$^3$] is doped in the electric field relaxation layer having the low concentration. The two layers can be continuously formed in the chemical vapor deposition (CVD) apparatus.

It is to be noted that by taking advantage of forming the contact layers and the channel protection layers separately, it is possible to cause average grain sizes of the first contact layers 116a and 116b and the second contact layers 117b and 117c to be smaller than those of the channel protection layers 115a and 115b. With this, it is possible to decrease the OFF-state current of the thin-film semiconductor device 100.

Each of the source electrode 120a and the drain electrode 120b in a pair in the thin-film transistor 100a is formed on a corresponding one of the contact layers 116a and 116b in the pair on the both ends of the channel protection layer 115a and at the both sides of the channel protection layer 115a above the channel region of the semiconductor film 113a. Moreover, the source electrode 120a and the drain electrode 120b in the pair are placed opposite to each other with a predetermined distance therebetween.

The source electrode 120a is formed over one of the ends (one end) of the channel protection layer 115a, the intrinsic semiconductor layer 114a, the semiconductor film 113a, and the gate insulating film 112 with the contact layer 116a therebetween. The drain electrode 120b is formed over the other of the ends (other end) of the channel protection layer 115a, the intrinsic semiconductor layer 114a, the semiconductor film 113a, and the gate insulating film 112 with the contact layer 116b therebetween.

Each of the source electrode 120c and the drain electrode 120d in a pair in the thin-film transistor 100b is formed on a corresponding one of the contact layers 117b and 117c in the pair on the both ends of the channel protection layer 115b and at the both sides of the channel protection layer 115b above the channel region of the semiconductor film 113b. Moreover, the source electrode 120c and the drain electrode 120d in the pair are placed opposite to each other with a predetermined distance therebetween.

The source electrode 120c is formed over one of the ends (one end) of the channel protection layer 115b, the intrinsic semiconductor layer 114b, the semiconductor film 113b, and the gate insulating film 112 with the contact layer 117b therebetween. The drain electrode 120d is formed over the other of the ends (other end) of the channel protection layer 115b, the intrinsic semiconductor layer 114b, the semiconductor film 113b, and the gate insulating film 112 with the contact layer 117c therebetween. Moreover, the drain electrode 120b and the source electrode 120c are formed integrally. It is to be noted that even when the drain electrode 120b and the source electrode 120c are not formed integrally, it is satisfactory that the drain electrode 120b and the source electrode 120c are connected electrically.

In this embodiment, the source electrodes 120a and 120c and the drain electrodes 120b and 120d can be each made of the single-layer structure or the multilayer structure of a conductive material, an alloy of conductive materials, or the like, and include aluminum (Al), molybdenum (Mo), tungsten (W), copper (Cu), titanium (Ti), chrome (Cr), or the like, for instance. In this embodiment, the source electrodes 120a and 120c and the drain electrodes 120b and 120d are each made of a three-layer structure of MoW/Al/MoW. The film thickness of each of the source electrodes 120a and 120c and the drain electrodes 120b and 120d can be approximately from 100 to 500 nm, for example.

(Method for Fabricating Thin-Film Semiconductor Device)

The following describes a method for fabricating the thin-film semiconductor device 100 according to this embodiment of the present invention, with reference to FIG. 2 to FIG. 10. FIG. 2 to FIG. 10 each are a schematic diagram showing one step in the method for fabricating a thin-film semiconductor device according to this embodiment of the present invention. (a) in each figure is a top view, and (b) in each figure is a cross-sectional view along A-A' line.

Figure 2:
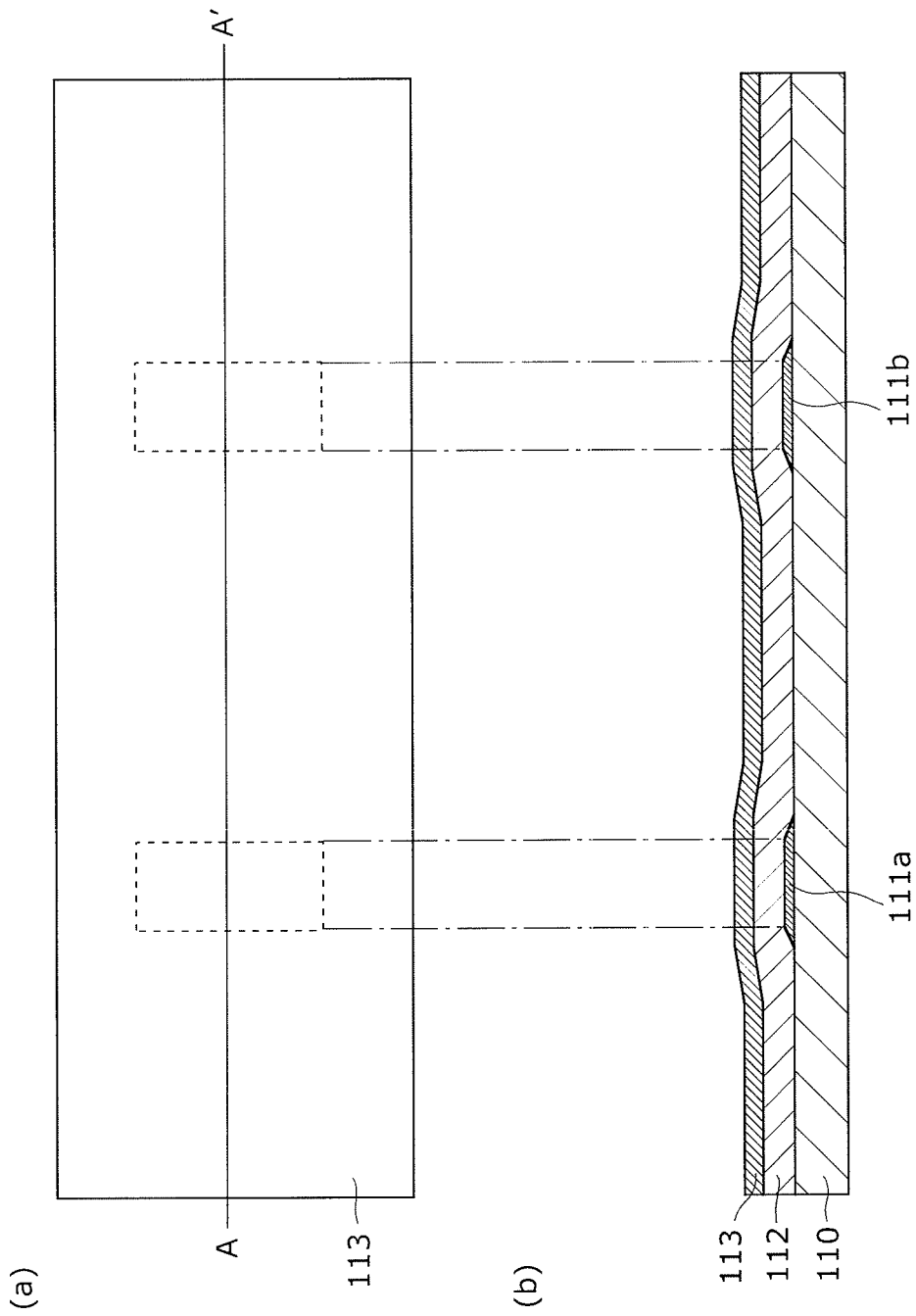
FIGS. 2(a) and (b) are schematic diagrams showing one step in a method for fabricating a thin-film semiconductor device according to Embodiment 1.

First, as shown in FIG. 2, a glass substrate is prepared as the substrate 110 (first step). It is to be noted that an undercoat layer including a silicon nitride film, a silicon oxide film, a silicon oxynitride film, and so on may be formed on the substrate 110 by the plasma CVD or the like, before the gate electrodes 111a and 111b are formed.

Next, the gate electrodes 111a and 111b are each formed in a predetermined shape on the substrate 110. For example, the gate electrodes 111a and 111b are formed in the predetermined shape by depositing, by sputtering, a gate metal film including MoW on the substrate and patterning the gate metal film using the photolithography and the wet etching (second step). The wet etching of MoW is performed using a chemical solution obtained by mixing, for instance, phosphoric acid (HPO$_4$), nitric acid (HNO$_3$), acetic acid (CH$_3$COOH), and water at a predetermined compounding ratio.

Next, the gate insulating film 112 is formed to cover the substrate 110 on which the gate electrodes 111a and 111b are formed (third step). For instance, the gate insulating film 112 including silicon oxide is deposited by the plasma CVD or the like to cover the gate electrodes 111a and 111b. The silicon oxide is deposited by introducing, for example, a silane gas (SiH$_4$) and a nitrous oxide gas (N$_2$O) at a predetermined ratio of concentration.

Next, the crystalline silicon thin film 113 included in the semiconductor layer having the channel region is formed on the gate insulating film 112 (fourth step). For instance, the crystalline silicon thin film 113 is formed by depositing, by the plasma CVD or the like, a non-crystalline silicon thin film including amorphous silicon (non-crystalline silicon) and crystallizing, by annealing, the non-crystalline silicon thin film after dehydrogenation annealing is performed. It is to be noted that the non-crystalline silicon thin film is deposited by introducing, for example, a silane gas (SiH$_4$) and a hydrogen gas (H$_2$) at a predetermined ratio of concentration.

It is to be noted that although the non-crystalline silicon thin film is crystallized by laser annealing using an excimer laser in this embodiment, laser annealing using a pulse laser having a wavelength of approximately 370 to 900 nm, laser annealing using a continuous wave laser having a wavelength of approximately 370 to 900 nm, or annealing by rapid thermal processing (RTP) may be used as a crystallization method. Moreover, instead of crystallizing the non-crystalline silicon thin film, the crystalline silicon thin film 113 may be deposited by a direct growth method or the like such as the CVD (chemical vapor deposition). It is to be noted that when the crystalline silicon thin film 113 is formed by the laser annealing, a heat of approximately 1000° C. is locally applied to the substrate, and when the crystalline silicon thin film 113 is formed by the CVD, a heat of approximately 350° C. is entirely applied to the substrate.

Subsequently, the silicon atoms of the crystalline silicon thin film 113 are hydrogenated by performing a hydrogen plasma process on the crystalline silicon thin film 113. The hydrogen plasma process is performed by, for instance, generating hydrogen plasma with radio-frequency (RF) power using, as a material, a gas including a hydrogen gas such as H2 and H$_2$/Argon (Ar), and irradiating the crystalline silicon thin film 113 with the hydrogen plasma. In the hydrogen plasma process, dangling bonds (defects) of the silicon atoms are hydrogen-terminated to decrease a crystal defect density of the crystalline silicon thin film 113, thereby increasing a crystallinity of the same.

Figure 3:
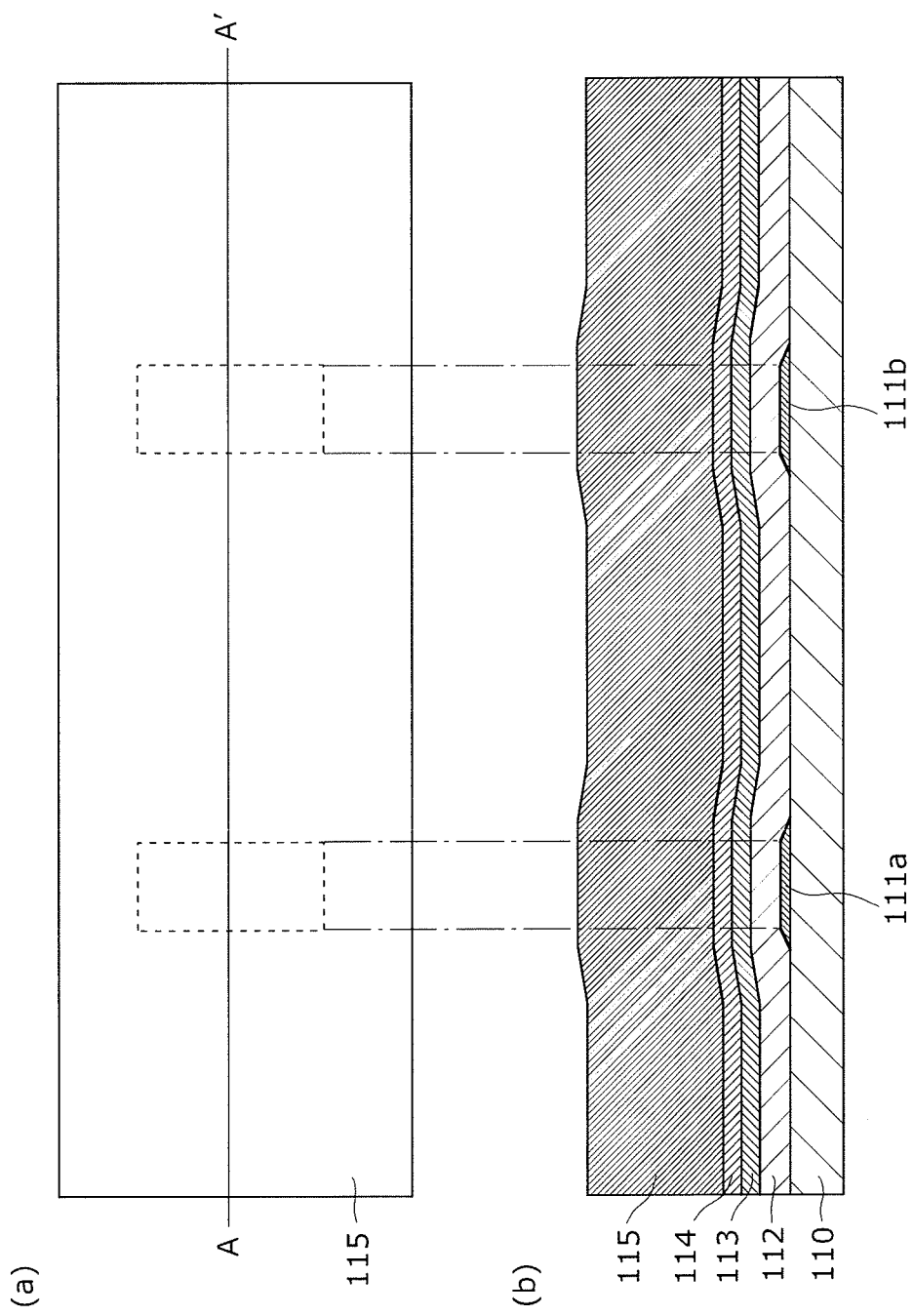
FIGS. 3(a) and (b) are schematic diagrams showing one step in the method for fabricating a thin-film semiconductor device according to Embodiment 1.

Next, as shown in FIG. 3, an amorphous silicon film 114 included in each of the intrinsic semiconductor layers 114a and 114b, intrinsic semiconductor layers in the present invention, is formed on a channel region of the crystalline silicon thin film 113 (tenth step). Moreover, in this step, the amorphous silicon film 114 is formed to allow energy levels at the lower edges of conduction bands of the crystalline silicon film 113 and the amorphous silicon film 114 to satisfy $E_{CP} < E_{C1}$.

Examples of the deposition condition include a condition that a RF power density when the crystalline silicon thin film 113 is formed is increased more than in a deposition condition of the amorphous silicon film or a deposition rate is decreased more than in the deposition condition of the amorphous silicon film.

Specifically, it is possible to deposit the amorphous silicon film 114 by introducing, using a parallel plate RF plasma CVD apparatus, a silane gas (SiH$_4$) and a hydrogen gas (H$_2$) at a predetermined ratio of concentration with a flow rate of the silane gas from 5 to 15 sccm, a flow rate of the hydrogen gas from 40 to 75 sccm, a pressure from 1 to 3 Torr, a RF power from 0.1 to 0.4 kw/cm$^{-2}$, and an electrode-substrate distance from 200 to 600 mm. In this embodiment, the deposition is performed with the flow rate of the silane gas 10 sccm, the flow rate of the hydrogen gas 60 sccm, the pressure being 1.5 Torr, the RF power 0.25 kw/cm$^{-2}$, and the electrode-substrate distance 300 mm.

By depositing the amorphous silicon film 114 to be in contact with the crystalline silicon thin film 113 under such a deposition condition, the amorphous silicon film 114 deposited near the surface of the crystalline silicon thin film 113 inherits the crystallinity of the crystalline silicon thin film 113 and is thus naturally crystallized. Moreover, the amorphous silicon film 114 has a crystallization rate that decreases as its deposition progresses from the crystalline silicon thin film 113, and after the crystallization rate reaches zero, a portion of the amorphous silicon film 114 has only amorphous component with such a crystallization rate. In other words, because a portion of the amorphous silicon film 114 deposited near the surface of the crystalline silicon thin film 113 is further crystallized with the crystalline silicon thin film 113 serving as a foundation layer, the portion of the amorphous silicon film 114 has a higher crystallization rate than the portion of the amorphous silicon film 114 near the surface of the amorphous silicon film 114.

Alternatively, it is also possible to deposit the amorphous silicon film 114 having a crystallization rate that varies progressively away from near the surface of the crystalline silicon thin film 113, by actively switching deposition conditions during the deposition of the amorphous silicon film. For instance, it is possible to deposit the amorphous silicon film 114 having the crystallization rate that varies progressively away from near the surface of the crystalline silicon thin film 113, by changing a ratio of concentration or a flow rate of a source gas of the silane gas (SiH$_4$) and the hydrogen gas (H$_2$) or by changing a pressure inside the vacuum apparatus.

With this, it is possible to form the amorphous silicon film 114 that satisfies $E_{CP} < E_{C1}$. It is to be noted that the amorphous silicon film 114 does not have to be a single layer unlike as described above, and may be a stacked film in which amorphous silicon films are stacked. For example, the amorphous silicon film 114 can be also considered as a single film including two layers (first intrinsic semiconductor film and second intrinsic semiconductor film) made of amorphous silicon and having different crystallization rates. Moreover, after an amorphous silicon film to be a precursor is formed, exposed to atmosphere temporarily, and laser-treated, the amorphous silicon film may be deposited again by the CVD in the vacuum apparatus.

Next, the channel protection layers 115a and 115b are each formed in a predetermined shape on the amorphous silicon film 114 (fifth step). First, a predetermined organic material for forming the channel protection layers 115a and 115b is applied on the amorphous silicon film 114 by a predetermined application method, and a channel protection layer forming film 115 is deposited on the entire surface of the amorphous silicon film 114 by spin coating or slit coating. The film thickness of the material can be controlled by the viscosity of the material or a coating condition (the number of rotations, speed of blade, and so on). It is to be noted that a photosensitive application-type material containing oxygen and carbon can be used as the material for the channel protection layer forming film 115. Subsequently, the channel protection layer forming film 115 is prebaked for approximately 60 seconds at the temperature of approximately 110° C. With this, a solvent in the channel protection layer forming film 115 is evaporated.

Figure 4:
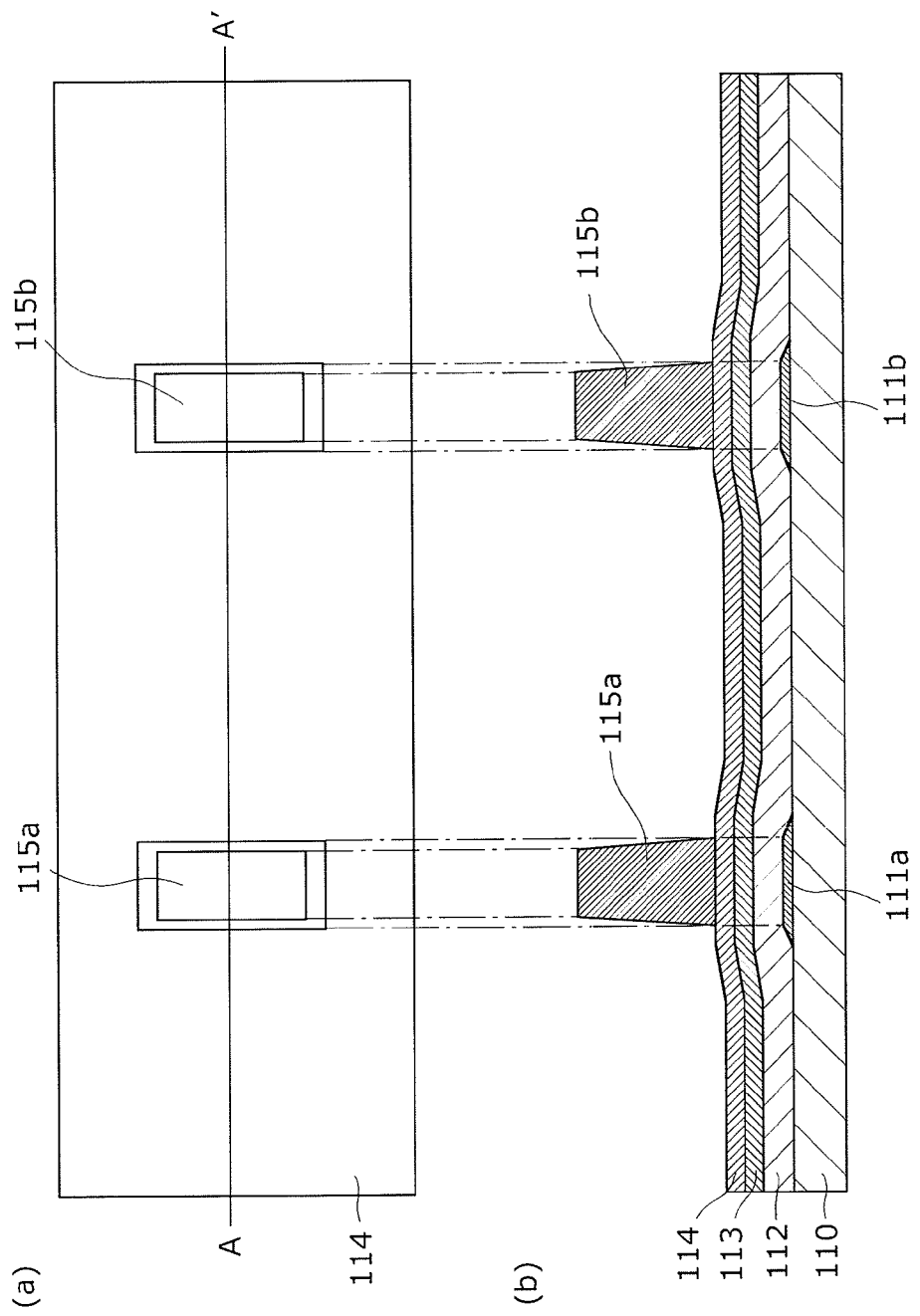
FIGS. 4(a) and (b) are schematic diagrams showing one step in the method for fabricating a thin-film semiconductor device according to Embodiment 1.

Then, as shown in FIG. 4, the channel protection layer forming film 115 is patterned by the back exposure using the gate electrodes 111a and 111b as masks and the development, and the channel protection layers 115a and 115b are each formed in the predetermined shape. Subsequently, the patterned channel protection layers 115a and 115b are solidified by being post-baked for approximately one hour at the temperature of 280° C. to 300° C. With this, it is possible to form the channel protection layers 115a and 115b whose film quality is increased due to the evaporation and decomposition of part of the component in each of the channel protection layers 115a and 115b.

Figure 5:
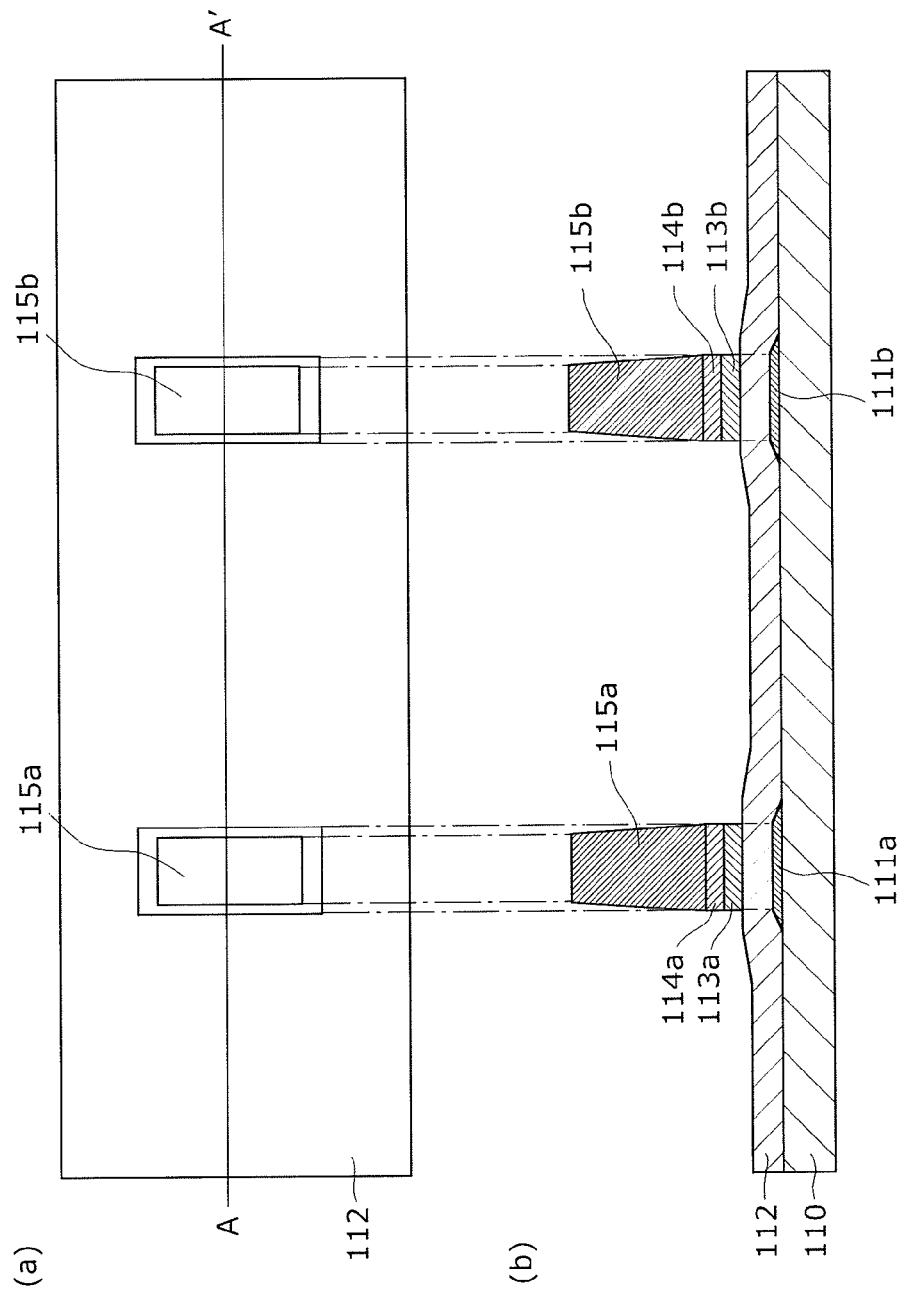
FIGS. 5(a) and (b) are schematic diagrams showing one step in the method for fabricating a thin-film semiconductor device according to Embodiment 1.

Next, as shown in FIG. 5, the crystalline silicon thin film 113 and the amorphous silicon film 114 are etched by dry etching using the channel protection layers 115a and 115b as masks, to remain only immediately below the channel protection layers 115a and 115b. With this, the semiconductor film 113a and the intrinsic semiconductor layer 114a constituting the thin-film transistor 100a and the semiconductor film 113b and the intrinsic semiconductor layer 114b constituting the thin-film transistor 100b are formed in isolation.

Moreover, with this step, a channel direction length of each of the channel protection layers 115a and 115b is made equal to that of each of the semiconductor films 113a and 113b having the respective channel regions, that is, included in the respective semiconductor layers, and the intrinsic semiconductor layers 114a and 114b.

Here, a depth to which the crystalline silicon thin film 113 and the amorphous silicon film 114 are etched or an end timing of the etching is detected using an end point monitor (EPM). Specifically, a state of an interface between the crystalline silicon thin film 113 and the gate insulating film 112 which appears in the etching is monitored. To put it another way, the gate insulating film 112, an oxide film, is detected in the etching step.

In an etching apparatus for drying etching, when an etching gas including halogen is supplied into a vacuum chamber, and an alternating voltage is applied between opposite electrodes, a plasma discharge is generated in the vacuum chamber. By placing the thin-film semiconductor device 100 in process in the vacuum chamber, part of the crystalline silicon thin film 113 and the amorphous silicon film 114 which is not covered with a photosensitive resist is etched by the halogen (radical) that is activated. Here, the activated halogen has characteristics of having a high etching rate for non-crystalline silicon and a low etching rate for a silicon oxide film. Thus, when a degree of vacuum in the vacuum chamber is maintained constant, the radical frequently forms a polymer substance with the non-crystalline silicon in a period during which the non-crystalline silicon is etched, and thus abundance becomes less as the radical in the vacuum chamber. Consequently, it is possible to understand an etching state transition from the amorphous silicon film 114 made of the non-crystalline silicon and the crystalline silicon thin film 113 to the gate insulating film 112 including the silicon oxide film, by monitoring the abundance of the radical in the vacuum chamber.

In the method for fabricating the thin-film semiconductor device 100 in the present invention, the abundance of the radical in the vacuum chamber is detected as an emission intensity of a specific wavelength extracted from an emission spectrum of the radical in etching gas. Specifically, a photo detector is caused to detect emission of light having the specific wavelength through a wavelength filter. The photo detector is, for instance, a CCD sensor and outputs, to a computing unit, the emission intensity of the radical as a voltage signal.

Because the state of the interface between the crystalline silicon thin film 113 and the gate insulating film 112 which appears in the etching can be monitored using the EPM as above, it is possible to detect a residue of the gate insulating film 112. With this, the depth to which the crystalline silicon thin film 113 and the amorphous silicon film 114 are etched or the etching end timing is detected, and the crystalline silicon thin film 113 and the amorphous silicon film 114 can be etched to a desired depth (e.g., a depth of a boundary between the gate insulating film 112 and the crystalline silicon thin film 113).

It is to be noted that the crystalline silicon thin film 113 and the amorphous silicon film 114 may be etched without the EPM but with a Cl-based gas having a high selection ratio for the amorphous silicon film and the silicon oxide film, that is, a high etching rate for the amorphous silicon film and a low etching rate for the silicon oxide film. In this case, it is possible to achieve the structure in the present invention by managing an etching time. The Cl-based gas is suitable for the present invention because of its high selection ratio in the etching.

Figure 6:
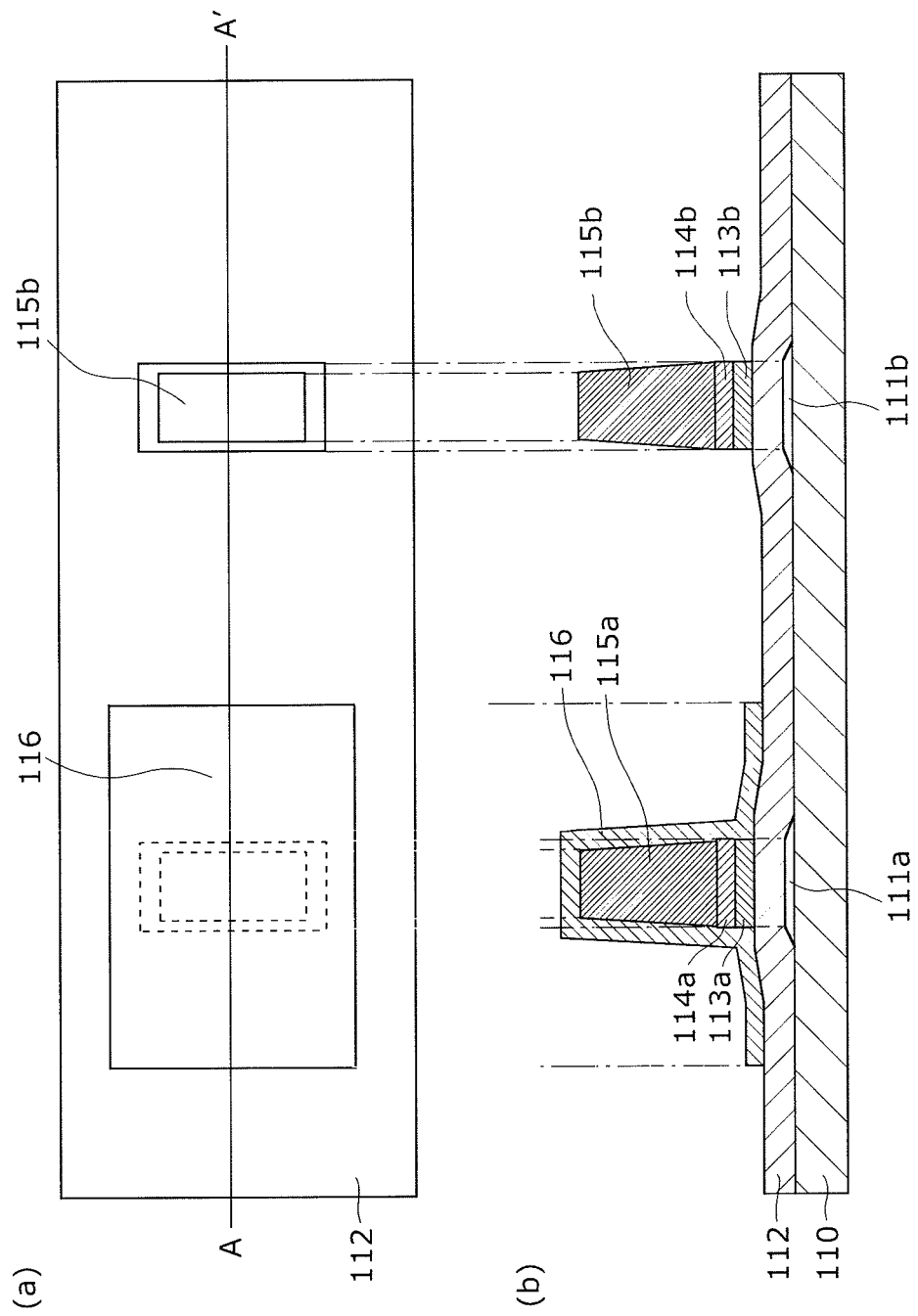
FIGS. 6(a) and (b) are schematic diagrams showing one step in the method for fabricating a thin-film semiconductor device according to Embodiment 1.

Next, a contact layer film 116 to be the contact layers 116a and 116b constituting the thin-film transistor 100a shown in FIG. 1 is formed (seventh step). As shown in FIG. 6, the contact layer film 116 is formed on the gate insulating film 112 to cover the top and sides of the channel protection layer 115a and the sides of the intrinsic semiconductor layer 114a and the semiconductor film 113a. For instance, the contact layer film 116 made of amorphous silicon doped with an impurity of a quinquevalent element such as phosphorous is deposited by the plasma CVD. Subsequently, a contact layer film is formed at a desired position by exposure and etching.

It is to be noted that the contact layer film 116 may include two layers of a lower electric field relaxation layer having a low concentration and an upper contact layer having a high concentration. The electric field relaxation layer having the low concentration can be formed by being doped with phosphorous of approximately $1 \times 10^{17}$ [atm/cm$^3$]. It is possible to continuously form the two layers in the CVD apparatus, for instance.

Figure 7:
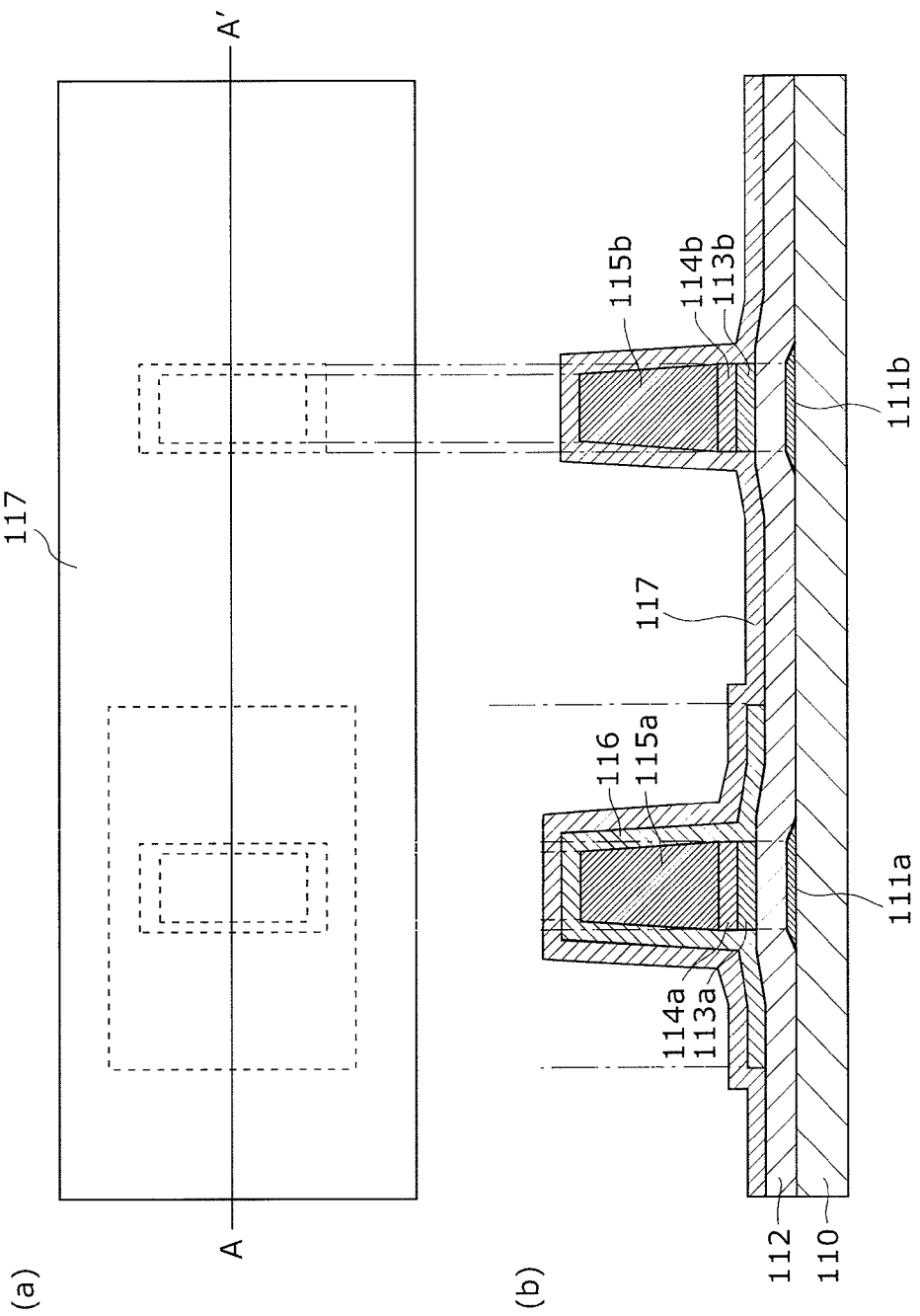
FIGS. 7(a) and (b) are schematic diagrams showing one step in the method for fabricating a thin-film semiconductor device according to Embodiment 1.

Next, a contact layer film 117 for forming the contact layers 117b and 117c constituting the thin-film transistor 100b shown in FIG. 1 is formed (eighth step). As shown in FIG. 7, the contact layer film 117 is formed on the gate insulating film 112 to cover the top and sides of the channel protection layer 115b, the sides of the intrinsic semiconductor layer 114b, and the contact layer film 116. For instance, the contact layer film 117 made of amorphous silicon doped with an impurity of a trivalent element such as boron is deposited by the plasma CVD.

It is to be noted that the contact layer film 117 may include two layers of a lower electric field relaxation layer having a low concentration and an upper contact layer having a high concentration. The electric field relaxation layer having the low concentration can be formed by being doped with boron of approximately $1 \times 10^{17}$ [atm/cm$^3$]. It is possible to continuously form the two layers in the CVD apparatus, for instance.

Figure 8:
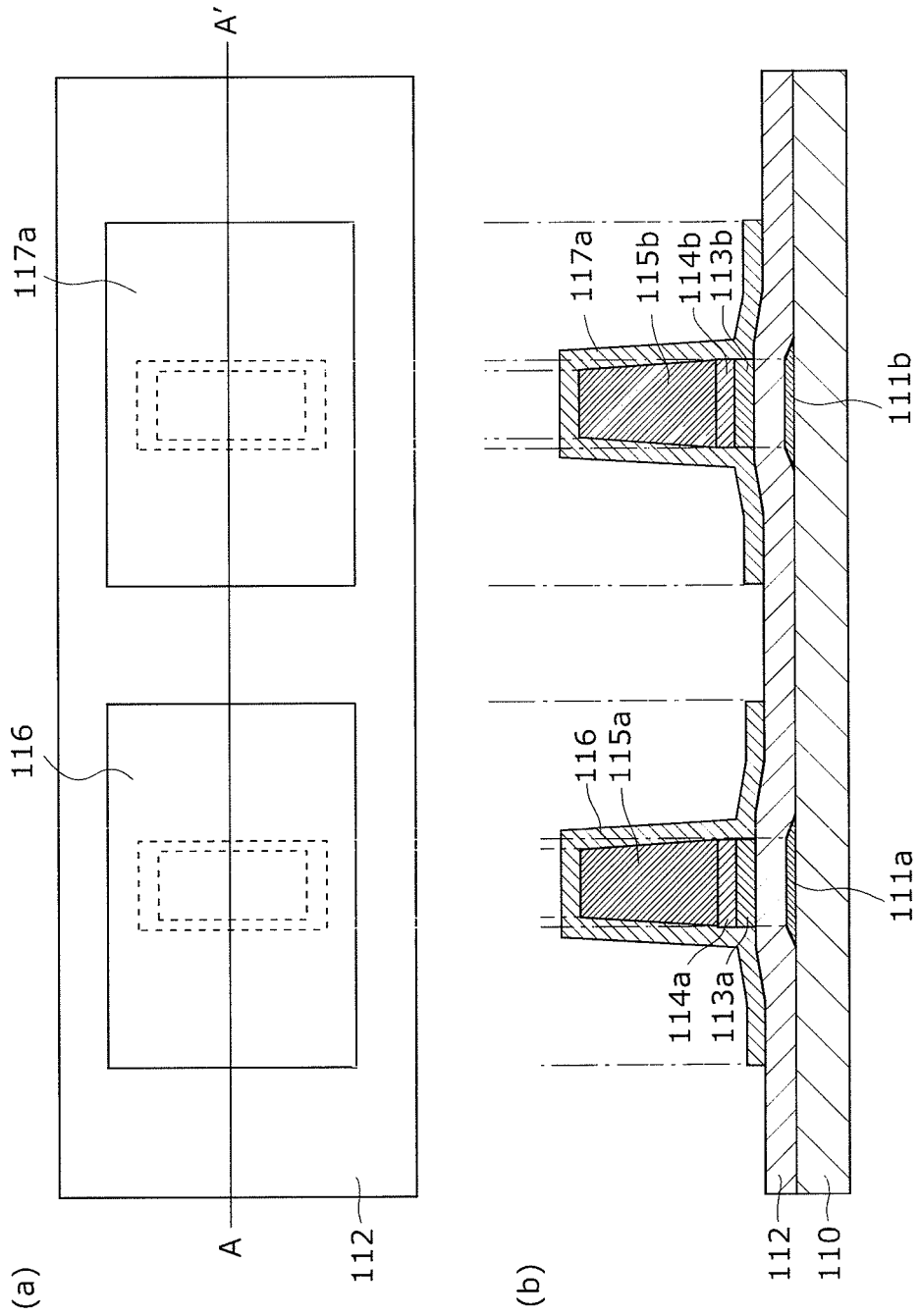
FIGS. 8(a) and (b) are schematic diagrams showing one step in the method for fabricating a thin-film semiconductor device according to Embodiment 1.

Next, as shown in FIG. 8, the contact layer 117a is formed in a predetermined shape by etching the contact layer film 117. Moreover, the contact layer film 117 on the contact layer film 116 of the thin-film transistor 100a is removed, and the contact layer film 117 on the gate insulating film 112 is etched by dry etching to separate the thin-film transistor 100a and the thin-film transistor 100b. In this case also, an amount of etching of the contact layer film 117 or an etching end timing is detected using the above EPM, and the contact layer film 117 can be etched to a desired depth.

Specifically, a state of an interface between the contact layer film 117 and the gate insulating film 112 which appears in the etching is monitored. To put it another way, the gate insulating film 112, an oxide film, is detected in the etching step.

In an etching apparatus for drying etching, when an etching gas including halogen is supplied into a vacuum chamber, and an alternating voltage is applied between opposite electrodes, a plasma discharge is generated in the vacuum chamber. By placing the thin-film semiconductor device 100 in process in the vacuum chamber, part of the contact layer film 117 which is not covered with a photosensitive resist is etched by the halogen (radical) that is activated. Here, the activated halogen has characteristics of having a high etching rate for non-crystalline silicon and a low etching rate for a silicon oxide film. Thus, when a degree of vacuum in the vacuum chamber is maintained constant, the radical frequently forms a polymer substance with the non-crystalline silicon in a period during which the non-crystalline silicon is etched, and thus abundance becomes less as the radical in the vacuum chamber. Consequently, it is possible to understand an etching state transition from the contact layer film 117 made of the non-crystalline silicon to the gate insulating film 112 formed of the silicon oxide film, by monitoring the abundance of the radical in the vacuum chamber.

In the method for fabricating the thin-film semiconductor device 100 in the present invention, the abundance of the radical in the vacuum chamber is detected as an emission intensity of a specific wavelength extracted from an emission spectrum of the radical in etching gas. Specifically, a photo detector is caused to detect emission of light having the specific wavelength through a wavelength filter. The photo detector is, for instance, a CCD sensor and outputs, to a computing unit, the emission intensity of the radical as a voltage signal.

Because the state of the interface between the contact layer film 117 and the gate insulating film 112 which appears in the etching can be monitored using the EPM as above, it is possible to detect a residue of the gate insulating film 112. With this, the depth to which the contact layer film 117 is etched or the etching end timing is detected, the contact layer 117a can be formed by etching the contact layer film 117 to a desired depth (e.g., depth of a boundary between the gate insulating film 112 and the contact layer film 117).

Moreover, to ensure an etching margin of the contact layer film 117, the contact layer film 116 may be formed to have a sufficient thickness. For example, the contact layer film 116 may be formed to have a thickness of approximately 80 nm. It is to be noted that even when the thickness of the contact layer film 116 is increased to approximately 80 nm, the TFT performance does not deteriorate.

Figure 9:
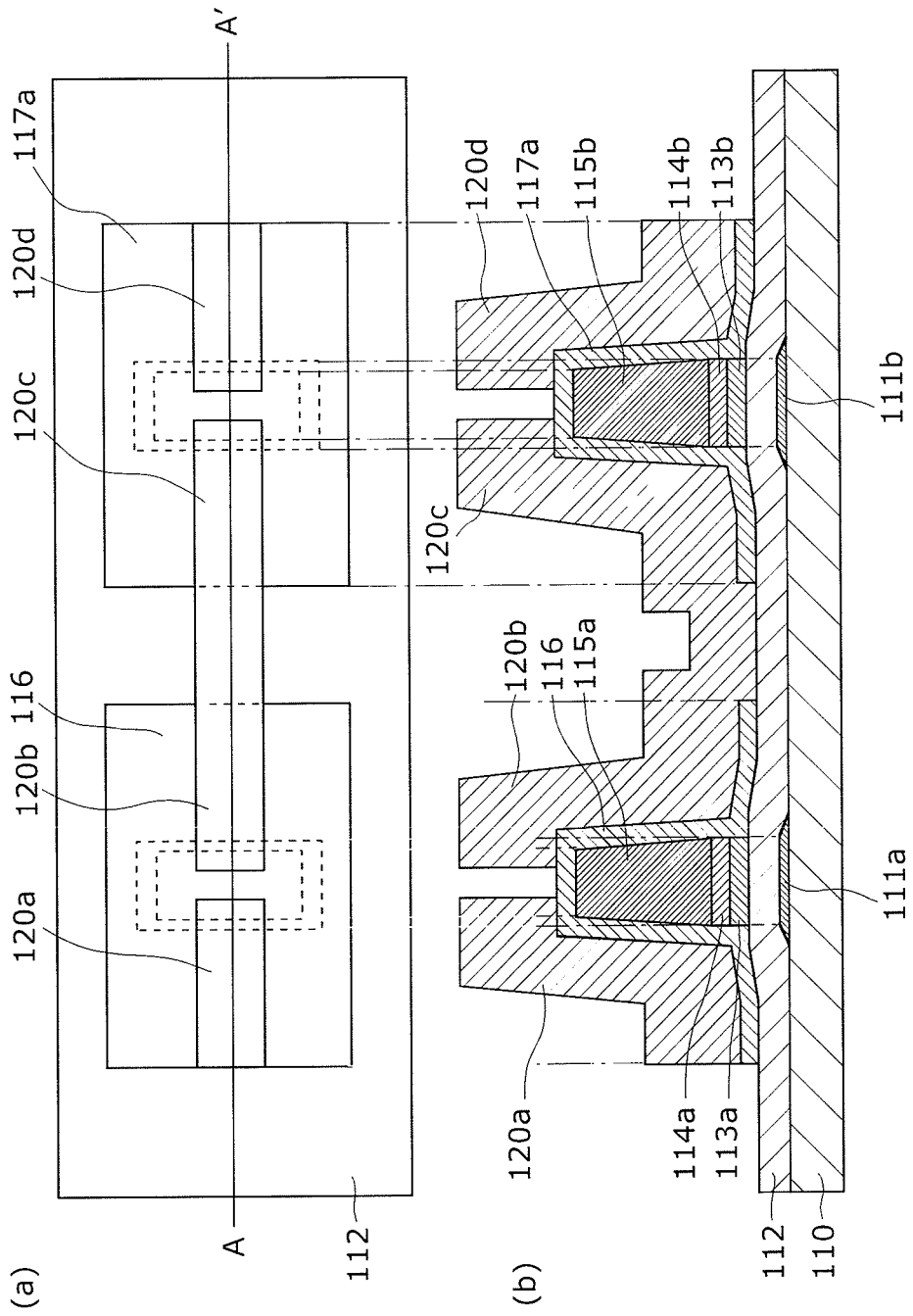
FIGS. 9(a) and (b) are schematic diagrams showing one step in the method for fabricating a thin-film semiconductor device according to Embodiment 1.

Next, as shown in FIG. 9, the source electrode 120*a* and the drain electrode 120*b* are patterned on the contact layer film 116. In addition, the source electrode 120*c* and the drain electrode 120*d* are patterned on the contact layer 117*a* (ninth step). In this case, first, a source-drain metal film which is made of a material to be each of the source electrodes 120*a* and 120*c* and the drain electrodes 120*b* and 120*d* is deposited by sputtering, for instance.

Subsequently, a resist patterned in a predetermined shape is formed on the source-drain metal film, and the source-drain metal film is patterned by wet etching. At this time, the contact layer film 116 and the contact layer 117*a* function as etching stoppers. Then, the source electrodes 120*a* and 120*c* and the drain electrodes 120*b* and 120*d* can be each formed in the predetermined shape as shown in FIG. 9, by removing the resist.

Figure 10:
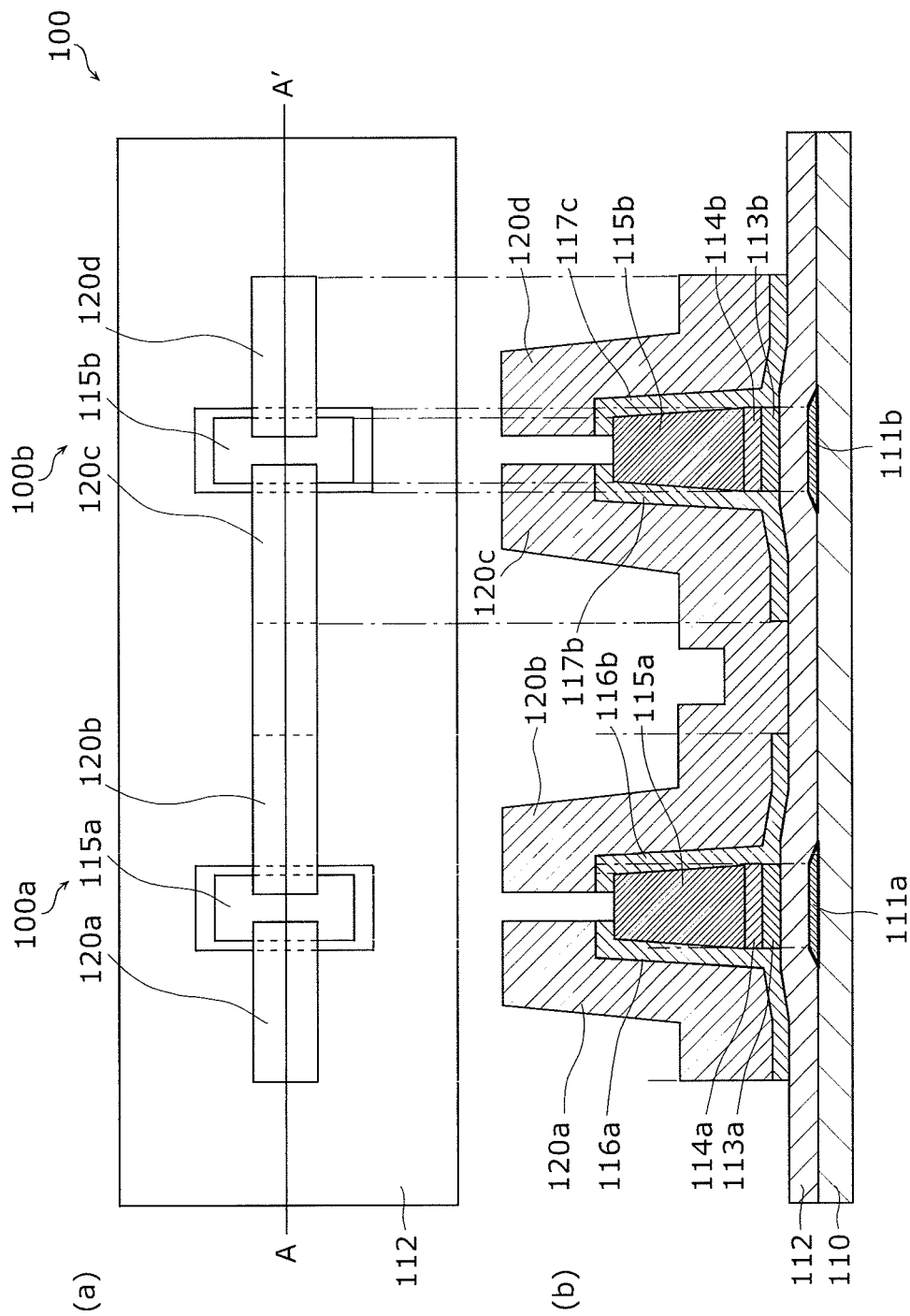
FIGS. 10(a) and (b) are schematic diagrams showing one step in the method for fabricating a thin-film semiconductor device according to Embodiment 1.

Next, the contact layer film 116 and the contact layer 117*a* are patterned by dry etching using the source electrodes 120*a* and 120*c* and the drain electrodes 120*b* and 120*d* as masks. With this, as shown in FIG. 10, it is possible to form the thin-film transistors 100*a* and 100*b* respectively including the contact layers 116*a* and 116*b* in the pair each of which is in the predetermined shape, the contact layers 117*b* and 117*c* in the pair each of which is in the predetermined shape, the intrinsic semiconductor layers 114*a* and 114*b*, and the semiconductor films 113*a* and 113*b*. It is to be noted that as stated above, the Cl-based gas may be used for the dry etching. The Cl-based gas is suitable for the present invention because of its high selection ratio in the etching.

As described above, it is possible to fabricate the thin-film semiconductor device 100 according to this embodiment of the present invention. Through the steps, the thin-film transistor 100*a* is a semiconductor transistor of n-type conductivity and has the source electrode 120*a* and the drain electrode 120*b* that are on the sides of the semiconductor film 113*a* and the intrinsic semiconductor layer 114*a* included in the semiconductor layer. In addition, the thin-film transistor 100*b* is a semiconductor transistor of p-type conductivity and has the source electrode 120*c* and the drain electrode 120*d* that are on the sides of the semiconductor film 113*b* and the intrinsic semiconductor layer 114*b* included in the semiconductor layer.

It is to be noted that with this structure, it is possible to achieve a CMOS structure with low-cost processing.

Figure 11:
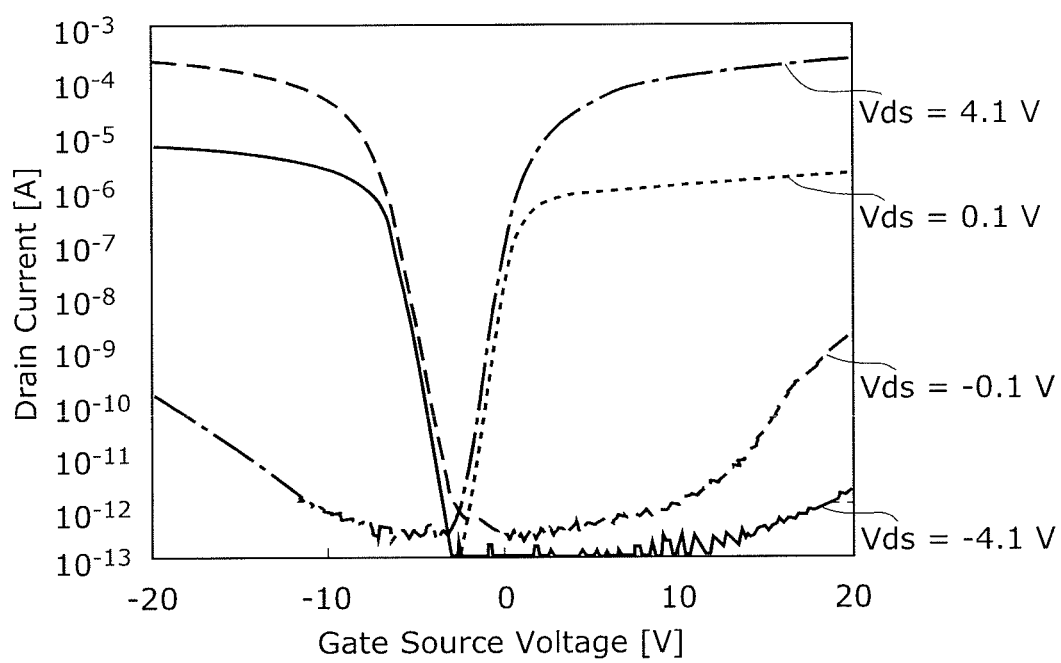
FIG. 11 is a graph showing operation of a thin-film semiconductor device according to Embodiment 1.

FIG. 11 is a graph showing operation of the thin-film semiconductor device 100. The graph shows a drain current when a voltage Vds=−4.1 V, −0.1 V, 0.1 V, and 4.1 V is applied between the drain and source of the thin-film semiconductor device 100. As shown in FIG. 11, because the drain current increases or decreases when Vds exceeds a threshold value, it is clear that the thin-film semiconductor device 100 effectively functions as a CMOS transistor.

As stated above, it has been verified that the thin-film semiconductor device 100 according to this embodiment effectively functions as the CMOS transistor.

As described above, the thin-film semiconductor device 100 according to this embodiment is capable of increasing the source-drain current characteristics, because the p-type contact layer and the n-type contact layer are not stacked in the p-type TFT. Moreover, in both the thin-film transistors 100*a* and 100*b*, the contact layers 116*a*, 116*b*, 117*b*, and 117*c* are formed on the respective portions of the tops and sides of the channel protection layers 115*a* and 115*b* and of the sides of the semiconductor films 13*a* and 113*b*. With this, the contact layers 116*a*, 116*b*, 117*b*, and 117*c* function as electric field relaxation layers when a drain current is high, and thus it is possible to increase the reliability of the thin-film semiconductor device 100 by decreasing the source-drain OFF-state current. In addition, the semiconductor films 113*a* and 113*b* and the contact layers 116*a*, 116*b*, 117*b*, and 117*c* can be made directly in contact with each other, and thus contact portions where the semiconductor films 113*a* and 113*b* and the contact layers 116*a*, 116*b*, 117*b*, and 117*c* are directly in contact with each other are effective mainly as current inlets. Thus, it is possible to provide the thin-film semiconductor device 100 whose TFT performance is increased.

Moreover, the intrinsic semiconductor layer 114*b* is provided between the semiconductor film 113*b* and the channel protection layer 115*b* as a back channel layer, and thus it is possible to perform a field shield by offsetting the positive fixed electric charge of the channel protection layer 115*b* by a charge density of negative carrier in a localized level density (trap density) of the intrinsic semiconductor layer 114*b*. With this, it is possible to reduce the formation of the back channel, and inhibit a leak current at a off time, thereby increasing the OFF characteristics. In addition, it is possible to reduce an occurrence of a kink phenomenon that is a phenomenon in which the drain current increases rapidly.

Here, with the structure where the intrinsic semiconductor layer 114*b* is provided between the semiconductor film 113*b* and the channel protection layer 115*b* as the back channel layer, especially in the p-type transistor, when the semiconductor film 113*b* and the channel protection layer 115*b* greatly differ in band gap, a current does not easily flow between the semiconductor film 113*b* and the contact layers 117*b* and 117*c*.

However, like the thin-film transistor 100*b* of the thin-film semiconductor device 100, because the semiconductor film 113*b* and the contact layers 117*b* and 117*c* can be directly in contact with each other by forming the contact layers 117*b* and 117*c* on the portions of the sides of the semiconductor film 113*b*, this problem can be solved.

Moreover, in the thin-film transistor 100*a* of n-type, the semiconductor layer 113*a* and the contact layers 116*a* and 116*b* can be made directly in contact with each other by forming the contact layers 116*a* and 116*b* on the portions of the sides of the semiconductor layer 113*a*, and thus it is possible to further increase the source-drain current characteristics.

Furthermore, the thin-film transistor 100*a* of n-type and the thin-film transistor 100*b* of p-type have the same structure except that the conductivity types of the contact layers are opposite, and thus it is possible to form the channel protection layers 115*a* and 115*b* in the same shape by performing the back exposure under the same condition using the gate electrodes 111*a* and 111*b* as masks. Consequently, it is possible to easily form the thin-film semiconductor device 100 having a CMOS structure.

Moreover, in comparison to a method for fabricating a CMOS structure using low-temperature polysilicon (LTPS), the thin-film transistor 100*a* of n-type and the thin-film transistor 100*b* of p-type can be formed differently without a step of impurity implantation, and thus it is possible to deal with increasing the CMOS structure in size, which has been conventionally difficult using the LTPS. Moreover, it is possible to reduce the number of masks for impurity implantation. Thus, it is possible to reduce the cost of fabricating the CMOS structure.

It is to be noted that although the crystalline silicon thin film 113 and the amorphous silicon film 114 are formed by continuous deposition in the same vacuum apparatus in the method for fabricating according to this embodiment, the crystalline silicon thin film 113 and the amorphous silicon film 114 may be separately deposited in separate steps under different deposition conditions. With this, it is possible to reduce a variation in each element of the crystalline silicon thin film 113 and the amorphous silicon film 114, and achieve a thin-film semiconductor device suitable for a large panel.

Furthermore, although the crystalline silicon thin film 113 and the amorphous silicon film 114 are patterned by simultaneous etching in the same step in the method for fabricating according to this embodiment, the crystalline silicon thin film 113 and the amorphous silicon film 114 may be separately patterned in separate steps. In this case, it is only necessary that the amorphous silicon film 114 which may have the same shape as or a different shape from the crystalline silicon thin film 113 is formed at least on the channel region.

Modification of Embodiment 1

The following describes a modification of Embodiment 1 according to an aspect of the present invention. A thin-film semiconductor device according to this modification differs from the thin-film semiconductor device according to Embodiment 1 in not including an intrinsic semiconductor layer on a semiconductor layer. For instance, when a channel protection layer of the thin-film semiconductor device is made of an inorganic material, an influence of back channel is less, thereby omitting formation of an amorphous silicon film.

Figure 12:
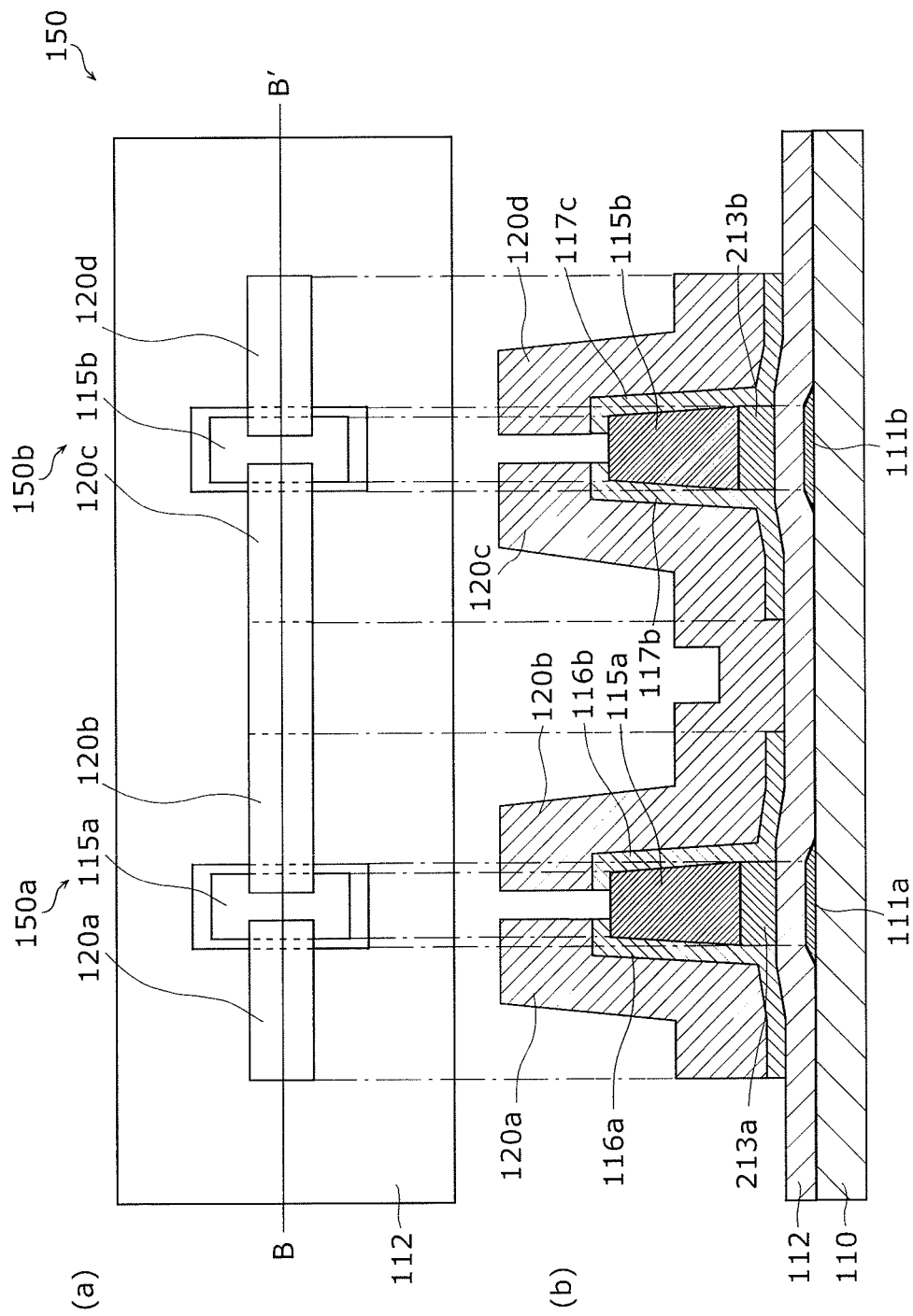
FIGS. 12(a) and (b) are schematic diagrams showing a structure of a thin-film semiconductor device according to a modification of Embodiment 1.

FIG. 12 is a schematic diagram showing a structure of a thin-film semiconductor device 150 according to the modification. (a) in the figure is a top view, and (b) in the figure is a cross-sectional view along B-B' line. It is to be noted that the same reference signs are assigned to structural elements in FIG. 12 that are the same as those shown in FIG. 1.

As shown in FIG. 12, the thin-film semiconductor device 150 is a thin-film semiconductor device including thin-film transistors 150a and 150b having opposite polarities. The thin-film transistors 150a and 150b are formed on the substrate 110, the gate electrode 111a and the gate electrode 111b formed on the substrate 110, and the gate insulating film 112 formed on the substrate 110 and the gate electrodes 111a and 111b, and constitute a complementary metal-oxide-semiconductor (CMOS) device.

The thin-film transistor 150a, one of the two thin-film transistors, is a transistor of n-type conductivity, the first conductivity type, and includes: a semiconductor layer 213a formed above the gate electrode 111a and having a channel region; the contact layers 116a and 116b of n-type conductivity each of which is formed in contact with a corresponding one of portions of the sides of the semiconductor layer 213a; the source electrode 120a formed on the contact layer 116a; and the drain electrode 120b formed opposite to the source electrode 120a on the contact layer 116b. Moreover, the channel protection layer 115a is formed above the semiconductor layer 213a. The semiconductor layer 213a includes a crystalline silicon thin film. Here, the contact layers 116a and 116b correspond to the first contact layer in the present invention.

The thin-film transistor 150b, the other of the two thin-film transistors, is a transistor of p-type conductivity, the second conductivity type, and includes: a semiconductor layer 213b formed above the gate electrode 111b and having a channel region; the contact layers 117b and 117c of p-type conductivity each of which is formed in contact with a corresponding one of portions of the sides of the semiconductor layer 213b; the source electrode 120c formed on the contact layer 117b; and the drain electrode 120d formed opposite to the source electrode 120c on the contact layer 117c. Moreover, a channel protection layer 115b is formed above the semiconductor layer. The semiconductor layer 213b includes a crystalline silicon thin film. Here, the contact layers 117b and 117c correspond to the second contact layer in the present invention.

Furthermore, a method for fabricating the thin-film semiconductor device 150 is substantially identical to the method for fabricating the thin-film semiconductor device 100 described in Embodiment 1. By omitting a step of forming the intrinsic semiconductor layers 114a and 114b in the method for fabricating the thin-film semiconductor device 100, it is possible to form the thin-film semiconductor device 150.

With this configuration, the p-type contact layer and the n-type contact layer are not stacked in the p-type TFT, and thus it is possible to increase source-drain current characteristics. Moreover, in the thin-film transistor 150a, because the contact layers 116a and 116b are formed on the portions of the top and sides of the channel protection layer 115a and on the portions of the sides of the semiconductor layer 213a, and function as the electric field relaxation layers when the drain current is high, it is possible to increase the reliability of the thin-film semiconductor device 150 by decreasing the source-drain OFF-state current. Furthermore, because the semiconductor layer 213a and the contact layers 116a and 116b can be made directly in contact with each other, the contact portion where the semiconductor layer 213a and the contact layers 116a and 116b are directly in contact with each other is effective mainly as the current inlet. Similarly, in the thin-film transistor 150b, because the contact layers 117b and 117c are formed on the portions of the top and sides of the channel protection layer 115b and on the portions of the sides of the semiconductor layer 213b, and function as the electric field relaxation layers when the drain current is high, it is possible to increase the reliability of the thin-film semiconductor device 150 by decreasing the source-drain OFF-state current. Furthermore, because the semiconductor layer 213b and the contact layers 117b and 117c can be made directly in contact with each other, the contact portion where the semiconductor layer 213b and the contact layers 117b and 117c are directly in contact with each other is effective mainly as the current inlet. With this, it is possible to increase the source-drain current characteristics in the thin-film transistors 150a and 150b.

Furthermore, the thin-film transistor 150a of n-type and the thin-film transistor 150b of p-type have the same structure except that the conductivity types of the contact layers are opposite, and thus it is possible to form the channel protection layers 115a and 115b in the same shape by performing the back exposure under the same condition using the gate electrodes 111a and 111b as the masks. Consequently, it is possible to easily form the thin-film semiconductor device 150 having a CMOS structure.

Furthermore, in comparison to a method for fabricating a CMOS structure using low-temperature polysilicon (LTPS), the p-type TFT and the n-type TFT can be formed differently without a step of impurity implantation, and thus it is possible to deal with increasing the CMOS structure in size, which has been conventionally difficult using the LTPS. Moreover, it is possible to reduce the number of masks for impurity implantation. Thus, it is possible to reduce the cost of fabricating the CMOS structure.

Embodiment 2

The following describes Embodiment 2 according to an aspect of the present invention. A thin-film semiconductor device according to this embodiment differs from the thin-film semiconductor device according to Embodiment 1 in that the intrinsic semiconductor layer of the thin-film semiconductor device according to Embodiment 1 includes a plurality of intrinsic semiconductor films. In this embodiment, a thin-film semiconductor device whose intrinsic semiconductor layer includes a first intrinsic semiconductor film and a second intrinsic semiconductor film is described as an example.

Figure 13:
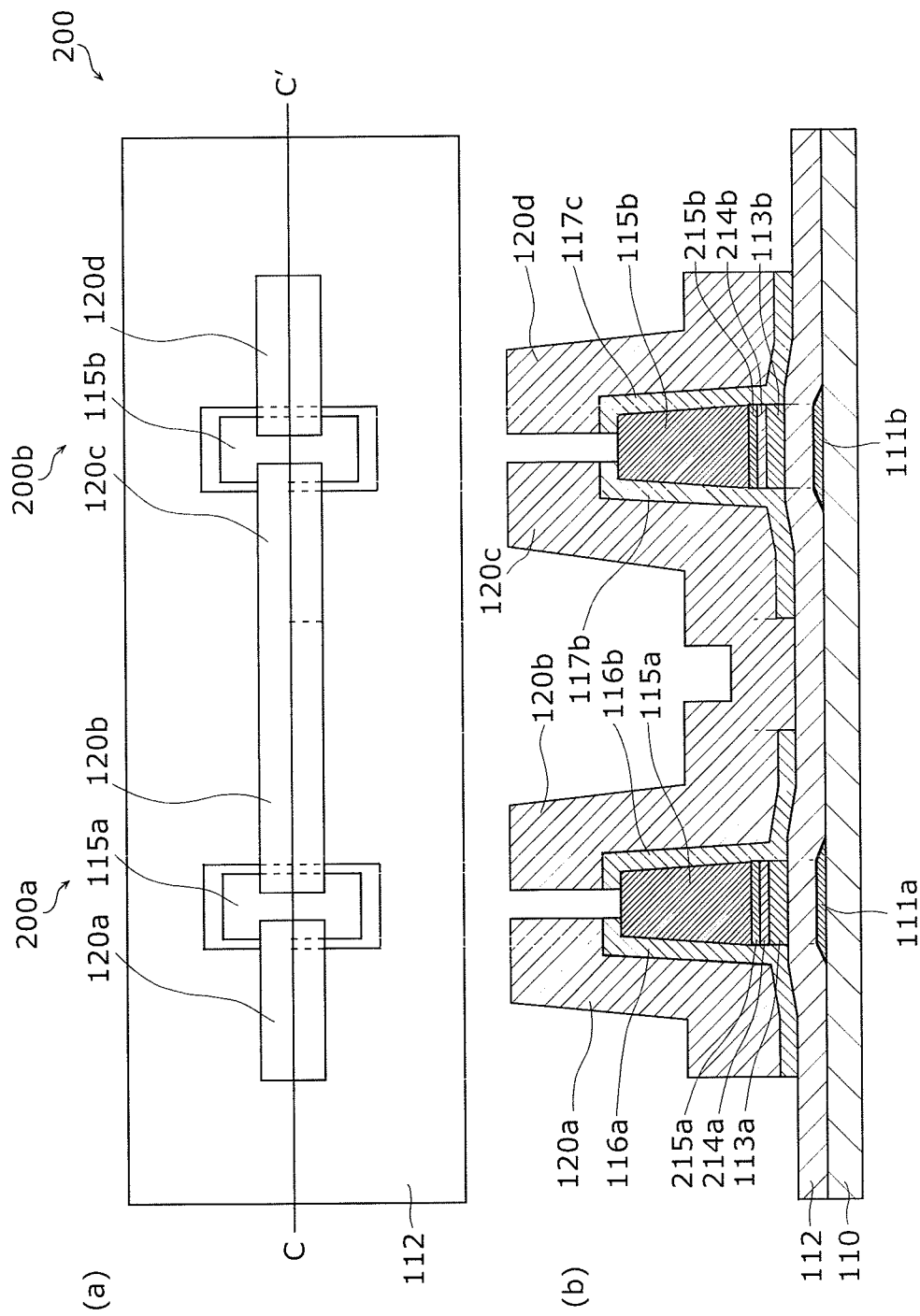
FIGS. 13(a) and (b) are schematic diagrams showing a structure of a thin-film semiconductor device according to Embodiment 2.

FIG. 13 is a schematic diagram showing a structure of the thin-film semiconductor device according to this embodiment. (a) in the figure is a top view, and (b) in the figure is a cross-sectional view along C-C' line. It is to be noted that the same reference signs are assigned to structural elements in FIG. 13 that are the same as those shown in FIG. 1.

As shown in FIG. 13, a thin-film semiconductor device 200 includes, in thin-film transistors 200a and 200b, first intrinsic semiconductor films 214a and 214b and second intrinsic semiconductor films 215a and 215b as intrinsic semiconductor layers on the semiconductor films 113a and 113b.

The first intrinsic semiconductor layers 214a and 214b and the second intrinsic semiconductor films 215a and 215b each are an amorphous silicon (intrinsic amorphous silicon) film, and specifically an amorphous silicon film not intentionally doped with an impurity.

The first intrinsic semiconductor films 214a and 214b are formed on the respective surfaces of the semiconductor films 113a and 113b. The second intrinsic semiconductor films 215a and 215b are formed continuously on the first intrinsic semiconductor films 214a and 214b. The film thickness of each of the first intrinsic semiconductor films 214a and 214b and the second intrinsic semiconductor films 215a and 215b can be approximately 20 nm. It is to be noted that a suitable range of the film thickness of each of the first intrinsic semiconductor films 214a and 214b is from 10 to 100 nm, and a suitable range of the film thickness of each of the second intrinsic semiconductor films 215a and 215b is from 10 to 40 nm.

Where energy levels at the lower edges of conduction bands (CBs) of the semiconductor films 113a and 113b and the first intrinsic semiconductor layers 214a and 214b are $E_{cp}$ and $E_{c1}$, respectively, the semiconductor films 113a and 113b, the first intrinsic semiconductor layers 214a and 214b, and the second intrinsic semiconductor films 215a and 215b are configured to satisfy $E_{cp} < E_{c1}$.

Moreover, in this embodiment, the first intrinsic semiconductor films 214a and 214b and the second intrinsic semiconductor films 215a and 215b are configured to differ in electron affinity. In this case, the first intrinsic semiconductor films 214a and 214b are each preferably configured to have a greater electron affinity than the second intrinsic semiconductor films 215a and 215b. It is to be noted that an electron affinity in an intrinsic semiconductor film means a difference between a vacuum level and an energy level at the lower edge of a conduction band. In other words, the electron affinity makes it possible to adjust the energy level at the lower edge of the conduction band of the intrinsic semiconductor film.

Moreover, in this embodiment, the first intrinsic semiconductor films 214a and 214b and the second intrinsic semiconductor films 215a and 215b are configured to differ in crystallization rate. In this case, the first intrinsic semiconductor films 214a and 214b are each preferably configured to have a higher crystallization rate than the second intrinsic semiconductor films 215a and 215b. Setting the crystallization rates in this manner easily allows $E_{cp} < E_{c1}$.

The first intrinsic semiconductor layers 214a and 214b in this embodiment include crystal silicon grains having a grain size of at least 5 nm and at most 100 nm. In addition, the first intrinsic semiconductor films 214a and 214b each have a crystallization rate in a thickness direction that gradually increases toward a corresponding one of the semiconductor films 113a and 113b. In this embodiment, the first intrinsic semiconductor films 214a and 214b include the crystal silicon grains whose grain size gradually increases toward the semiconductor films 113a and 113b. In contrast, the second intrinsic semiconductor films 215a and 215b in this embodiment are not crystallized, and thus each have a crystallization rate of zero.

In this embodiment, each of the first intrinsic semiconductor films 214a and 214b and the second intrinsic semiconductor films 215a and 215b is formed of an amorphous silicon (intrinsic amorphous silicon) film not intentionally doped with an impurity. For example, in the TFTs after fabrication, each of the first intrinsic semiconductor films 214a and 214b and the second intrinsic semiconductor films 215a and 215b is still an amorphous silicon film (non-crystalline silicon film), and can be configured to have a different energy level at the lower edge of its conduction band. Alternatively, one of the first intrinsic semiconductor films 214a and 214b and the second intrinsic semiconductor films 215a and 215b are the amorphous silicon films, the other of the first intrinsic semiconductor films 214a and 214b and the second intrinsic semiconductor films 215a and 215b are the crystalline silicon thin films including crystalline silicon, and each of the first intrinsic semiconductor films 214a and 214b and the second intrinsic semiconductor films 215a and 215b can be configured to have a different energy level at the lower edge of its conduction band. It is to be noted that although generally a composition of the amorphous silicon film includes only the amorphous component, a composition of an amorphous silicon film in this embodiment may include only the amorphous component or microcrystalline component.

Moreover, the first intrinsic semiconductor films 214a and 214b function as conduction band adjustment layers for adjusting energy levels at the lower edges of conduction bands between the semiconductor films 113a and 113b and the second intrinsic semiconductor films 215a and 215b. By adjusting the energy levels $E_{c1}$ at the lower edges of the conduction bands of the first intrinsic semiconductor films 214a and 214b in a desired manner, it is possible to reduce an occurrence of a kink phenomenon that is a phenomenon in which a drain current increases rapidly. Thus, it is possible to provide the thin-film semiconductor device whose TFT performance is increased.

In the thin-film semiconductor device 200 according to this embodiment, the second intrinsic semiconductor films 215a and 215b formed immediately below the channel protection layers 115a and 115b each include an amorphous silicon film having a relatively large band gap. With this, it is possible to increase OFF characteristics by reducing formation of the back channel due to positive fixed electric charge contained in the channel protection layers 115a and 115b. Especially, in this embodiment, because the channel protection layers 115a and 115b are each made of an organic application material, and much more fixed electric charge is contained in the channel protection layers 115a and 115b, the second intrinsic semiconductor films 215a and 215b each preferably include the amorphous silicon film.

It is to be noted that it is possible to adjust an energy level at the lower edge of a conduction band of a semiconductor film such as the first intrinsic semiconductor films 214a and 214b by changing an electron affinity or a band gap of the semiconductor film in this embodiment. In addition, in this embodiment, by adjusting the energy levels $E_{c1}$ at the lower edges of the conduction bands of the first intrinsic semiconductor films 214a and 214b, the energy level $E_{cp}$ of each of the semiconductor films is configured to satisfy $E_{cp}<E_{c1}$.

For instance, by configuring the first intrinsic semiconductor films 214a and 214b and the second intrinsic semiconductor films 215a and 215b having silicon as main component to have different band gaps, it is possible to adjust the energy levels at the lower ends of the conduction bands of the first intrinsic semiconductor films 214a and 214b and the second intrinsic semiconductor films 215a and 215b. In this case, the first intrinsic semiconductor films 214a and 214b are preferably configured to have band gaps closer to the band gaps of the semiconductor films 113a and 113b than to the band gaps of the second intrinsic semiconductor films 215a and 215b. With this configuration, by making continuous energy levels at the lower edges of conduction bands in connection parts between the semiconductor films 113a and 113b and the first intrinsic semiconductor films 214a and 214b, it is possible to reduce an occurrence of a spike (discontinuous part where a large difference in energy level occurred) in the connection parts. Thus, it is possible to reduce the occurrence of the kink phenomenon.

As stated above, it is also possible to adjust the energy levels $E_{c1}$ at the lower edges of the conduction bands of the first intrinsic semiconductor films 214a and 214b having the silicon as the main component, by changing a crystallization rate of a semiconductor film such as the first intrinsic semiconductor films 214a and 214b. In this embodiment, the first intrinsic semiconductor film 214a and 214b including the amorphous silicon film are each configured to have the crystallization rate higher than that of each of the second intrinsic semiconductor films 215a and 215b including the amorphous silicon film. With this configuration, by making continuous the energy levels at the lower ends of the conduction bands in the connection parts between the semiconductor films 113a and 113b and the first intrinsic semiconductor films 214a and 214b, it is possible to reduce the occurrence of the spike in the connection parts. Thus, it is possible to reduce the occurrence of the kink phenomenon.

Figure 14:
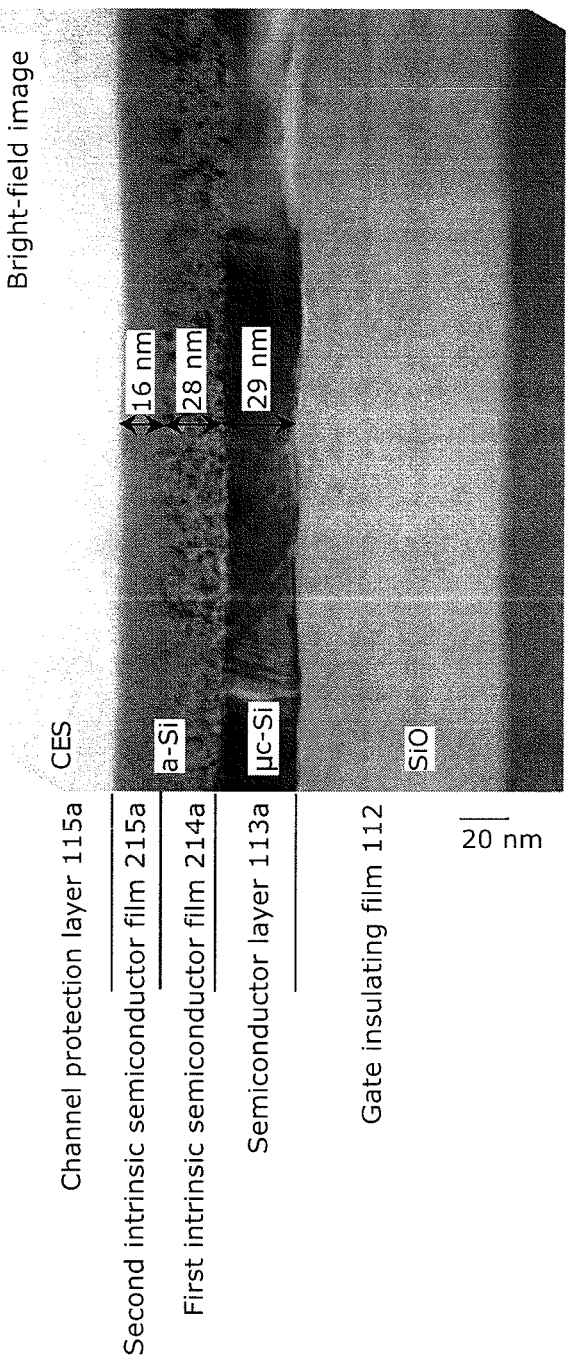
FIG. 14 is a TEM image when a cross-section of the thin-film semiconductor device according to Embodiment 2 is observed in a bright field.

FIG. 14 is a TEM image when a cross-section of the thin-film transistor 200a of the thin-film semiconductor device 200 according to this embodiment of the present invention is observed in a bright field. It is to be noted that deposition conditions for the first intrinsic semiconductor film 214a and the second intrinsic semiconductor film 215a in FIG. 14 are described as below.

As shown in FIG. 14, it is clear that the semiconductor layer of the thin-film semiconductor device 200 according to this embodiment includes: the semiconductor film 113a having a microcrystal structure with a film thickness of 29 nm; the first intrinsic semiconductor film 214a including an amorphous silicon film having a film thickness of 28 nm; and the second intrinsic semiconductor film 215a including an amorphous silicon film having a film thickness of 16 nm.

Moreover, in FIG. 14, a crystallization rate of each of the semiconductor films increases in an order of the second intrinsic semiconductor film 215a, the first intrinsic semiconductor film 214a, and the semiconductor film 113a, and it is especially clear that the crystallization rate of the first intrinsic semiconductor film 214a gradually increases toward the semiconductor film 113a.

The following describes a method for fabricating the thin-film semiconductor device 200 according to this embodiment. The method for fabricating the thin-film semiconductor device 200 is the same as the method for fabricating the thin-film semiconductor device 100 according to Embodiment 1 except for a step of forming the first intrinsic semiconductor films 214a and 214b and the second intrinsic semiconductor films 215a and 215b constituting an intrinsic semiconductor layer. Thus, only the step of forming the first intrinsic semiconductor films 214a and 214b and the second intrinsic semiconductor films 215a and 215b is described below.

After the gate electrodes 111a and 111b, the gate insulating film 112, and the crystalline silicon thin film 113 are formed on the substrate 110, a stacked film is formed that includes a first amorphous silicon film 214 for forming the first intrinsic semiconductor films 214a and 214b on the channel region of the crystalline silicon thin film 113 and a second amorphous silicon film 215 for forming the second intrinsic semiconductor films 215a and 215b on the channel region of the crystalline silicon thin film 113. Moreover, in this step, the first amorphous silicon film 214 and the second amorphous silicon film 215 are formed to allow energy levels at the lower ends of conduction bands of the crystalline silicon thin film 113, the first amorphous silicon film 214, and the second amorphous silicon film 215 to satisfy $E_{CP}<E_{C1}$.

In this embodiment, the first amorphous silicon film 214 and the second amorphous silicon film 215 are continuously deposited in the same vacuum apparatus. In other words, the first amorphous silicon film 214 and the second amorphous silicon film 215 are deposited without breaking a vacuum. For example, it is possible to continuously deposit the first amorphous silicon 214 and the second amorphous silicon film 215 by depositing, by the plasma CVD or the like, an amorphous silicon film on the crystalline silicon thin film 113 under a predetermined deposition condition after the crystalline silicon thin film 113 is formed. Examples of the deposition condition include a condition that a RF power density when the crystalline silicon thin film 113 is formed is increased more than in a deposition condition of the amorphous silicon film or a deposition rate is decreased more than in the deposition condition of the amorphous silicon film.

Specifically, it is possible to deposit the stacked film of the amorphous silicon film 214 and the second amorphous silicon film 215 by introducing, using a parallel plate RF plasma CVD apparatus, a silane gas ($SiH_4$) and a hydrogen gas ($H_2$) at a predetermined ratio of concentration with a flow rate of the silane gas from 5 to 15 sccm, a flow rate of the hydrogen gas from 40 to 75 sccm, a pressure from 1 to 3 Torr, a RF power from 0.1 to 0.4 kw/cm$^{-2}$, and an electrode-substrate distance from 200 to 600 mm. In this embodiment, the deposition is performed with the flow rate of the silane gas 10 sccm, the flow rate of the hydrogen gas 60 sccm, the pressure 1.5 Torr, the RF power 0.25 kw/cm$^{-2}$, and the electrode-substrate distance 300 mm.

By depositing the first amorphous silicon film 214 to be in contact with the crystalline silicon thin film 113 under such a deposition condition, the first amorphous silicon film 214 deposited near the surface of the crystalline silicon thin film 113 inherits the crystallinity of the crystalline silicon thin film 113 and is thus naturally crystallized. Moreover, the second amorphous silicon film 215 deposited on the first amorphous silicon film 214 has a crystallization rate that decreases as its deposition progresses from the crystalline silicon thin film 113, and after the crystallization rate reaches zero, a portion of the second amorphous silicon film 215 has only amorphous component with such a crystallization rate. To put it another way, the first amorphous silicon film 214 deposited near the surface of the crystalline silicon thin film 113 is further crystallized with the crystalline silicon thin film 113 serving as a foundation layer. With this, a lower layer (first amorphous silicon film 214) is formed to naturally have a crystallization rate higher than that of an upper layer (second amorphous silicon film 215).

Alternatively, it is also possible to deposit the first amorphous silicon film 214 and the second amorphous silicon film 215 having the different crystallization rates, by actively switching deposition conditions during the deposition of the amorphous silicon film. For instance, it is possible to deposit the first amorphous silicon film 214 and the second amorphous silicon film 215 having the different crystallization rates, by changing a ratio of concentration or a flow rate of a source gas of the silane gas ($SiH_4$) and the hydrogen gas ($H_2$) or by changing a pressure inside the vacuum apparatus.

With this, it is possible to simultaneously form the first amorphous silicon film 214 and the second amorphous silicon film 215 satisfying $E_{CP} < E_{C1}$. It is to be noted that because the first amorphous silicon film 214 and the second amorphous silicon film 215 are formed by the continuous deposition, the first amorphous silicon film 214 and the second amorphous silicon film 215 can be also considered as a single film including two layers (first amorphous silicon film 214 and second amorphous silicon film 215) having different crystallization rates.

Moreover, with the above step, it is possible to form an intrinsic semiconductor layer including the first amorphous silicon film 214 and the second amorphous silicon film 215 having different electron affinities. In this embodiment, it is possible to form the first amorphous silicon film 214 and the second amorphous silicon film 215 to allow the electron affinity of the first amorphous silicon film 214 to be greater than that of the second amorphous silicon film 215.

Furthermore, with the step, it is possible to form an intrinsic semiconductor layer including the first amorphous silicon film 214 and the second amorphous silicon film 215 having different band gaps. In this embodiment, it is possible to form the first amorphous silicon film 214 and the second amorphous silicon film 215 to allow the band gap of the first amorphous silicon film 214 to be closer to a band gap of the crystalline silicon thin film 113 than to the band gap of the second amorphous silicon film 215.

It is to be noted that like the thin-film semiconductor device 100 described in Embodiment 1, the semiconductor films 113a and 113b, the first intrinsic semiconductor films 214a and 214b, the second intrinsic semiconductor films 215a and 215b, and the contact layer 117a are formed by patterning the crystalline silicon thin film 113, the first amorphous silicon film 214, the second amorphous silicon film 215, and the contact layer film 117 after the contact layer film 116 and the contact layer film 117 is formed.

As described above, in the thin-film semiconductor device 200 according to this embodiment, because the intrinsic semiconductor layer is formed of the first intrinsic semiconductor films 214a and 214b and the second intrinsic semiconductor films 215a and 215b, it is possible to adjust the energy levels of the first amorphous silicon film 214 included in the first intrinsic semiconductor films 214a and 214b and the second amorphous silicon film 215 included in the second intrinsic semiconductor films 215a and 215b, by changing the electron affinities, crystallization rates, or band gaps of the first amorphous silicon film 214 and the second amorphous silicon film 215. With this, it is possible to increase source-drain current characteristics, thereby providing an efficient thin-film semiconductor device.

It is to be noted that although the first amorphous silicon film 214 and the second amorphous silicon film 215 are formed by the continuous deposition in the same vacuum apparatus in the method for fabricating according to this embodiment, the first amorphous silicon film 214 and the second amorphous silicon film 215 may be separately deposited in separate steps under different deposition conditions. With this, it is possible to reduce a variation between elements of the first amorphous silicon film 214 and the second amorphous silicon film 215, and achieve a thin-film semiconductor device suitable for a large panel.

Moreover, in the method for fabricating according to this embodiment, the crystalline silicon thin film 113, the first amorphous silicon film 214, and the second amorphous silicon film 215 may be patterned by simultaneous etching in the same step, or may be separately patterned in separate steps. In this case, the first amorphous silicon film 214, the second amorphous silicon film 215, and the crystalline silicon thin film 113 may have the same shape or different shapes. It is only necessary that the first amorphous silicon film 214 and the second amorphous silicon film 215 are formed at least on the channel regions.

Furthermore, although the energy levels at the lower edges of the conduction bands are adjusted by changing the electron affinities, crystallization rates, or band gaps of the first amorphous silicon film 214 and the second amorphous silicon film 215 by adjusting the deposition conditions in the step of depositing the first amorphous silicon film 214 and the second amorphous silicon film 215, an adjustment of energy levels at the lower edges of conduction bands is not limited to this. For example, the energy levels at the lower edges of the conduction bands may be adjusted by doping an impurity such as carbon to the first amorphous silicon film 214 having silicon as the main component in the step of depositing the first amorphous silicon film 214 and the second amorphous silicon film 215. Alternatively, when energy levels at the upper edges of valence bands are adjusted, an impurity such as germanium may be doped to the first amorphous silicon film 214 having silicon as the main component in the step of depositing the first amorphous silicon film 214 and the second amorphous silicon film 215. It is to be noted that when the impurity such as carbon and germanium is doped to the first amorphous silicon film 214, the first amorphous silicon film 214 and the second amorphous silicon film 215 are preferably deposited in separate steps.

Moreover, in this embodiment, because electrons accumulated on the side of the drain electrode cause spikes in the conduction bands, the spikes may be reduced by adjusting the energy levels at the lower edges of the conduction bands. In addition, it is also conceivable that positive holes accumulated on the side of the source electrode cause spikes in the valence bands. In this case, spikes in valence bands of the crystalline silicon thin film 113, the first amorphous silicon film 214, and the second amorphous silicon film 215 may be reduced by adjusting the energy levels at the upper edges of the valence bands.

In this case, as stated above, by changing the electron affinities, crystallization rates, or band gaps of the crystalline silicon thin film 113, the first amorphous silicon film 214, and the second amorphous silicon film 215, it is possible to adjust the energy levels at the upper edges of the valence bands of the semiconductor films. Alternatively, it is also possible to adjust the energy levels at the upper edges of the valence bands of the semiconductor films such as the first amorphous silicon film 214 having silicon as the main component, by doping the impurity such as germanium (Ga) to the semiconductor films. Because such doping of germanium or the like allows band offsets on the sides of the valence bands, it is possible to change the energy levels at the upper edges of the valence bands of the semiconductor films such as the first amorphous silicon film 214.

Next, an example where the thin-film semiconductor device according to this embodiment is applied to a display device is described with reference to FIG. 15. It is to be noted that an example of application to an organic EL display device is described in this embodiment.

Figure 15:
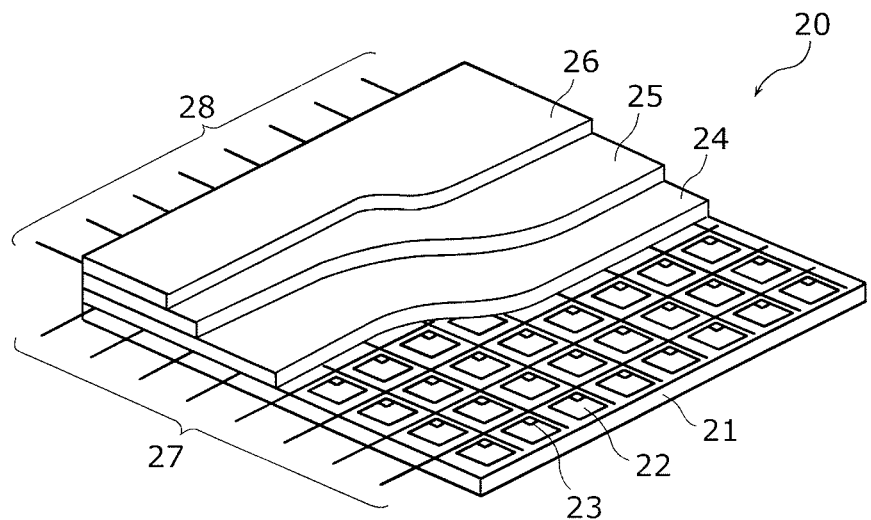
FIG. 15 is a partially cutaway perspective view of an organic EL display device according to the embodiments.

FIG. 15 is a partially cutaway perspective view of an organic EL display device according to this embodiment of the present invention. The above thin-film semiconductor device can be used as a switching transistor of an active matrix substrate in the organic EL display device, a driving transistor of the same, or a driver placed outside of a panel.

As shown in FIG. 15, an organic EL display device 20 includes: an active matrix substrate (TFT array substrate) 21; pixels 22 arranged in a matrix on the active matrix substrate 21; pixel circuits 23 connected to the pixels 22 and arranged in an array on the active matrix substrate 21; an anode 24, an organic EL layer 25, and a cathode 26 (transparent electrode) sequentially stacked on the pixels 22 and the pixel circuits 23; and source lines 27 and gate lines 28 that connect a control circuit (not illustrated) to each of the pixel circuits 23. The organic EL layer 25 includes stacked layers such as an electronic transport layer, an emission layer, and a hole transport layer.

Figure 16:
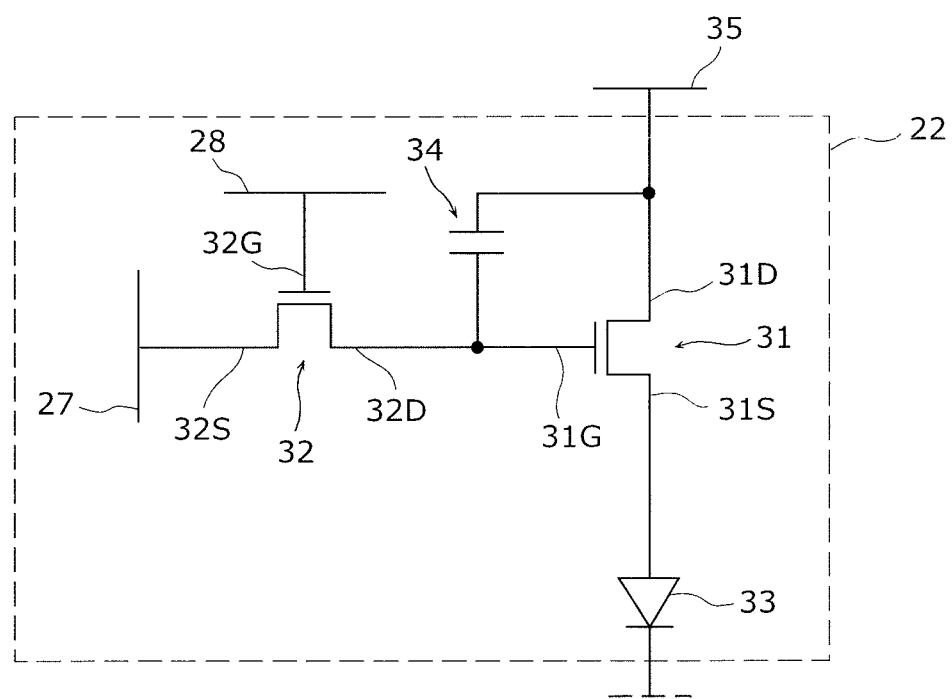
FIG. 16 is a diagram showing a circuit configuration of a pixel using a thin-film semiconductor device according to the embodiments.

Next, a circuit configuration of each of the pixels 22 in the organic EL display device 20 is described with reference to FIG. 16. FIG. 16 is a diagram showing a circuit configuration of a pixel using a thin-film semiconductor device according to this embodiment of the present invention.

As shown in FIG. 16, the pixel 22 includes a driving transistor 31, a switching transistor 32, an organic EL element 33, and a capacitor 34. The driving transistor 31 is a transistor that drives the organic EL element 33, and the switching transistor 32 is a transistor for selecting the pixel 22.

The switching transistor 32 has a source electrode 32S connected to one of the source lines 27, a gate electrode 32G connected to one of the gate lines 28, and a drain electrode 32D connected to the capacitor 34 and the gate electrode 31G of the driving transistor 31.

The driving transistor 31 has a drain electrode 31D connected to a power line 35 and a source electrode 31S connected to the anode of an organic EL element 33.

In this configuration, when a gate signal is input to the gate line 28 to turn the switching transistor 320N, a signal voltage supplied through the source line 27 is applied to the capacitor 34. The hold voltage applied to the capacitor 34 is held throughout a one frame period. With the hold voltage, conductance of the driving transistor 31 changes in an analog manner, and a drive current corresponding to an emission gradation flows from the anode of organic EL element 33 to the cathode of the same. With this, the organic EL element 33 emits light, thereby displaying a predetermined image.

It is to be noted that the organic EL display device using the organic EL element is described in this embodiment, the thin-film semiconductor device can be applied to another display device using the active matrix substrate such as a liquid crystal display device, a solid-state imaging device, a display panel, a mother substrate for mobile terminal panel, and so on. In particular, the display device thus configured can be used as a flat panel display and applied to every electronic device having a display panel such as a television set, a personal computer, and a cellular phone.

In addition, the display device can be applied to a CMOS sensor, a solid-state imaging device using a CMOS sensor, and an electronic device such as a digital camera. Such a solid-state imaging device can be applied to an electronic device such as a digital camera.

Although the thin-film semiconductor device and the method for fabricating the same in the present invention are described above based on the embodiments, the thin-film semiconductor device and the method for fabricating the same in the present invention are not limited to the embodiments.

For instance, although the contact layers 116a and 116b and the contact layers 117b and 117c are used as the contact layers of n-type conductivity type and the contact layers of p-type conductivity type, respectively, in the embodiments, the contact layers 116a and 116b and the contact layers 117b and 117c may be used as the contact layers of p-type conductivity type and the contact layers of n-type conductivity type, respectively.

Moreover, although the CMOS-type TFT including the n-type thin-film transistor and the p-type thin-film transistor is described as the thin-film semiconductor device in the embodiments, the thin-film semiconductor device may be a CMOS-type TFT used as a selection transistor or a driving transistor in a pixel circuit or a CMOS-type TFT used as a driver provided outside pixels or the like, for example.

Furthermore, the thin-film semiconductor device is not limited to the CMOS-type TFT, and may have one of the n-type transistor and the p-type transistor used as a transistor in a pixel circuit and the other of the n-type transistor and the p-type transistor used as a transistor in a driver circuit.

Moreover, although the intrinsic semiconductor films are configured to have the crystal silicon grains whose grain size gradually increases toward the semiconductor film in the embodiments, the intrinsic semiconductors may each be configured to have a crystal grain (crystal silicon grain) density that gradually increases toward the semiconductor film. In this case also, the intrinsic semiconductor films may each be configured to have the crystallization rate in the thickness direction that gradually increases toward the semiconductor film.

Various modifications to the embodiment that can be conceived by those skilled in the art, and forms configured by combining constituent elements in different embodiments and modifications thereof without departing from the teachings of the present invention are included in the scope of the present invention.

INDUSTRIAL APPLICABILITY

An organic thin-film transistor according to the present invention can be widely used for a display device such as a television set, a personal computer, and a cellular phone, a solid-state imaging device such as a digital camera, or various other electrical devices.

REFERENCE SIGNS LIST

20 Organic EL display device
21 Active matrix substrate
22 Pixel
23 Pixel
24 Anode
25 Organic EL layer
26 Cathode 27 Source line
28 Gate line
31 Driving transistor
32 Switching transistor
33 Organic EL element
34 Capacitor
35 Power line
100, 150, 200 Thin-film semiconductor device
100a, 100b, 150a, 150b, 200a, 200b Thin-film transistor
110 Substrate
111a, 111b Gate electrode
112 Gate insulating film
113 Crystalline silicon thin film
113a, 113b Semiconductor film
114 Amorphous silicon film
114a, 114b Intrinsic semiconductor layer
115 Channel protection layer forming film
115a, 115b Channel protection layer
116, 117 Contact layer film
116a, 116b, 117a, 117b, 117c Contact layer
120a, 120c Source electrode
120b, 120d Drain electrode
213a, 213b Semiconductor layer
214 First amorphous silicon film
214a, 214b First intrinsic semiconductor layer
215 Second amorphous silicon film
215a, 215b Second intrinsic semiconductor layer

The invention claimed is:

1. A method for fabricating a thin-film semiconductor device having two thin-film transistors, the method comprising:
preparing a substrate;
forming two gate electrodes on the substrate;
forming a gate insulating film on the substrate and the two gate electrodes;
forming, on the gate insulating film, semiconductor layers each having, as a channel region, a region that is opposite to a corresponding one of the two gate electrodes with the gate insulating film therebetween;
forming, by application, channel protection layers above the respective channel regions, the channel protection layers being separated from each other;
etching the semiconductor layers using the channel protection layers as masks;
forming a first contact layer of a first conductivity type on a portion of one of the channel protection layers and on a portion of sides of one of the semiconductor layers that is below the one of the channel protection layers;
forming a second contact layer of a second conductivity type on a portion of the other of the channel protection layers and on a portion of sides of the other of the semiconductor layers that is below the other of the channel protection layers, the second conductivity being different from the first conductivity type; and
forming a source electrode on a portion of each of the first contact layer and the second contact layer, and forming a drain electrode on an other portion of each of the first contact layer and the second contact layer to be opposite to the source electrode,
wherein the forming of a second contact layer includes:
forming the second contact layer on a portion of the other of the channel protection layers, on a portion of the sides of the other of the semiconductor layers that is below the other of the channel protection layers, and above the first contact layer; and
removing the second contact layer formed above the first contact layer.

2. The method for fabricating a thin-film semiconductor device according to claim 1,
wherein the first contact layer and the second contact layer have an average grain size smaller than an average grain size of the channel region.

3. The method for fabricating a thin-film semiconductor device according to claim 1,
wherein each of the semiconductor layers includes a semiconductor film and an intrinsic semiconductor layer that is non-crystalline,
the forming of semiconductor layers includes forming the intrinsic semiconductor layer at least on the channel region, and
in the forming of the intrinsic semiconductor layer, the intrinsic semiconductor layer is formed to satisfy $E_{cp} < E_{c1}$, where energy levels at lower edges of conduction bands of the semiconductor film and the intrinsic semiconductor layer are $E_{cp}$ and $E_{c1}$, respectively.

4. The method for fabricating a thin-film semiconductor device according to claim 3,
wherein in the forming of the intrinsic semiconductor layer, a first intrinsic semiconductor film is formed as the intrinsic semiconductor layer on the semiconductor film, and a second intrinsic semiconductor film is formed as the intrinsic semiconductor layer on the first intrinsic semiconductor film, and
the first intrinsic semiconductor film and the second intrinsic semiconductor film are formed of an amorphous silicon film.

5. The method for fabricating a thin-film semiconductor device according to claim 4,
wherein in the forming of the intrinsic semiconductor layer, the first intrinsic semiconductor film and the second intrinsic semiconductor film are continuously formed in a same vacuum apparatus, and the first intrinsic semiconductor film and the second intrinsic semiconductor film are formed to achieve a crystallization rate of the first intrinsic semiconductor film higher than a crystallization rate of the second intrinsic semiconductor film.

6. The method for fabricating a thin-film semiconductor device according to claim 1,
wherein in the forming of a first contact layer, the first contact layer is formed to have a film thickness greater than a film thickness of the second contact layer.

7. The method for fabricating a thin-film semiconductor device according to claim 1,
wherein each of the semiconductor layers has a channel direction length equal to a channel direction length of each of the channel protection layers.

8. A thin-film semiconductor device having two thin-film transistors,
wherein each of the two thin-film transistors includes:
a gate electrode;
a gate insulating film on the gate electrode;
a semiconductor layer which is on the gate insulating film and has, as a channel region, a region that is opposite to the gate electrode with the gate insulating film therebetween;
a channel protection layer on the channel region;
a contact layer in contact with a portion of sides of the channel region;
a source electrode on the contact layer; and
a drain electrode opposite to the source electrode on the contact layer, wherein the contact layer of one of the two thin-film transistors has a conductivity type different from a conductivity type of the contact layer of the other of the two thin-film transistors, and wherein the contact layer has an average grain size smaller than an average grain size of the channel region.

9. A thin-film semiconductor device having two thin-film transistors, wherein each of the two thin-film transistors includes:

a gate electrode;

a gate insulating film on the gate electrode;

a semiconductor layer which is on the gate insulating film and has, as a channel region, a region that is opposite to the gate electrode with the gate insulating film therebetween;

a channel protection layer on the channel region;

a contact layer in contact with a portion of sides of the channel region;

a source electrode on the contact layer; and a drain electrode opposite to the source electrode on the contact layer, wherein the contact layer of one of the two thin-film transistors has a conductivity type different from a conductivity type of the contact layer of the other of the two thin-film transistors, wherein each of the two thin-film transistors includes a channel protection layer above the semiconductor layer, and wherein the channel protection layer has a channel direction length equal to a channel direction length of the semiconductor layer.

10. The thin-film semiconductor device according to claim 9, wherein the semiconductor layer includes:

a semiconductor film; and an intrinsic semiconductor layer that is non-crystalline and between the semiconductor film and the channel protection layer.

11. The thin-film semiconductor device according to claim 10, wherein the semiconductor film is formed of crystalline silicon, and the intrinsic semiconductor layer is formed of amorphous silicon.

12. The thin-film semiconductor device according to claim 11, wherein $E_{cp} < E_{c1}$ is satisfied, where energy levels at lower edges of conduction bands of the semiconductor film and the intrinsic semiconductor layer are $E_{cp}$ and $E_{c1}$, respectively.

13. The thin-film semiconductor device according to claim 10, wherein the intrinsic semiconductor layer includes a first intrinsic semiconductor film formed on the semiconductor film, and a second intrinsic semiconductor film formed on the first intrinsic semiconductor film, and the first intrinsic semiconductor film and the second intrinsic semiconductor film have different electron affinities.

14. The thin-film semiconductor device according to claim 13, wherein each of the first intrinsic semiconductor film and the second intrinsic semiconductor film includes silicon as a main component, and has a different band gap.

15. The thin-film semiconductor device according to claim 13, wherein each of the first intrinsic semiconductor film and the second intrinsic semiconductor film is an amorphous silicon film.

16. The thin-film semiconductor device according to claim 13, wherein the first intrinsic semiconductor film has a crystallization rate higher than a crystallization rate of the second intrinsic semiconductor film.

17. The thin-film semiconductor device according to claim 13, wherein an energy level $E_{cp}$ at a lower edge of a conduction band of the semiconductor film and an energy level $E_{c1}$ at a lower edge of conduction band of the first intrinsic semiconductor film are adjusted to prevent a spike from occurring in a part where the semiconductor film and the first intrinsic semiconductor film are connected.

* * * * *